United States Patent
Hashimoto et al.

(10) Patent No.: US 8,940,462 B2
(45) Date of Patent: Jan. 27, 2015

(54) PHOTOMASK BLANK, PHOTOMASK, METHOD OF MANUFACTURING THE SAME, AND METHOD OF MANUFACTURING A SEMICONDUCTOR DEVICE

(75) Inventors: Masahiro Hashimoto, Tokyo (JP); Atsushi Kominato, Tokyo (JP)

(73) Assignee: Hoya Corporation, Tokyo (JP)

( * ) Notice: Subject to any disclaimer, the term of this patent is extended or adjusted under 35 U.S.C. 154(b) by 198 days.

(21) Appl. No.: 13/121,851

(22) PCT Filed: Sep. 30, 2009

(86) PCT No.: PCT/JP2009/005021
§ 371 (c)(1), (2), (4) Date: May 12, 2011

(87) PCT Pub. No.: WO2010/038445
PCT Pub. Date: Apr. 8, 2010

(65) Prior Publication Data
US 2011/0229807 A1     Sep. 22, 2011

(30) Foreign Application Priority Data
Sep. 30, 2008   (JP) .................. 2008-252416

(51) Int. Cl.
G03F 1/80     (2012.01)
G03F 1/00     (2012.01)
G03F 1/54     (2012.01)

(52) U.S. Cl.
CPC .. *G03F 1/80* (2013.01); *G03F 1/14* (2013.01); *G03F 1/54* (2013.01)
USPC ........................................................ 430/5

(58) Field of Classification Search
USPC ...................................... 430/4–5
See application file for complete search history.

(56) References Cited

U.S. PATENT DOCUMENTS

2002/0012851 A1 *  1/2002  Coronel et al. ............. 430/5
2002/0098421 A1    7/2002  Hasegawa et al.
(Continued)

FOREIGN PATENT DOCUMENTS

JP   2006-78807 A   3/2006
JP   2007-33470 A   2/2007
(Continued)

OTHER PUBLICATIONS

Communication dated Feb. 7, 2014, issued by the Taiwanese Patent Office in corresponding Application No. 098133236.

*Primary Examiner* — Stephen Rosasco
(74) *Attorney, Agent, or Firm* — Sughrue Mion, PLLC

(57) ABSTRACT

[Object] A photomask blank for use in producing a photomask for exposure with an ArF excimer laser. The photomask blank is intended to be applied to the 32-nm DRAM half-pitch (hp) and succeeding generations in the semiconductor design rule.

[Solution] The photomask blank is for use in producing a photomask to which an exposure light having a wavelength not longer than 200 nm is applied. The photomask blank is characterized by comprising a transparent substrate, a light-shielding film formed on the transparent substrate and containing molybdenum and silicon, and an etching mask film formed directly on the light-shielding film and containing chromium. The photomask blank is further characterized in that the light-shielding film comprises a light-shielding layer and an antireflection layer which have been disposed in this order from the transparent substrate side, the light-shielding layer having a molybdenum content of 9-40 at %, and that the etching mask film has a chromium content of 45 at % or lower.

12 Claims, 20 Drawing Sheets

| Example No. | | Example 1-1 | Example 1-2 | Example 1-3 | Example 1-4 | Example 1-5 | Example 1-6 | Example 1-7 | Example 1-8 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 100 nm | 100 nm | 100 nm | 100 nm | 100 nm | 100 nm | 100 nm | 100 nm |
| | Aspect Ratio (line width 40nm : thickness) | 1:2.5 | 1:2.5 | 1:2.5 | 1:2.5 | 1:2.5 | 1:2.5 | 1:2.5 | 1:2.5 |
| Etching Mask (EM) Film | Material | CrOCN | CrOCN | CrOCN | CrOCN | CrOC | CrOC | CrOC | CrOC |
| | Cr Content Ratio | 33 % | 33 % | 33 % | 33 % | 35 % | 35 % | 35 % | 35 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 93.1 nm | 86.2 nm | 79.3 nm | 72.4 nm | 93.1 nm | 86.2 nm | 79.3 nm | 71.9 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CDlinearity | | ○ | ○ | ○ | ○ | ○ | ○ | ○ | ○ |
| CDUniformity | | ○ | ○ | ○ | ○ | ○ | ○ | ○ | ○ |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

(56) References Cited

U.S. PATENT DOCUMENTS

| | | | |
|---|---|---|---|
| 2003/0109126 A1 | 6/2003 | Terasawa et al. | |
| 2006/0110667 A1 | 5/2006 | Hasegawa et al. | |
| 2007/0020534 A1 | 1/2007 | Yoshikawa et al. | |
| 2007/0212618 A1* | 9/2007 | Yoshikawa et al. | 430/5 |
| 2007/0212619 A1 | 9/2007 | Yoshikawa et al. | |
| 2007/0248897 A1 | 10/2007 | Yoshikawa et al. | |
| 2008/0063950 A1 | 3/2008 | Yoshikawa et al. | |

FOREIGN PATENT DOCUMENTS

| | | |
|---|---|---|
| JP | 2007-241060 A | 9/2007 |
| JP | 2007-241065 A | 9/2007 |
| JP | 2007-241137 A | 9/2007 |
| JP | 2007-292824 A | 11/2007 |
| TW | 498435 B | 8/2002 |
| TW | 200413865 A | 8/2004 |
| TW | I289331 B | 11/2007 |
| WO | 2009/123172 A1 | 10/2009 |

* cited by examiner

| Example No. | | Example 1-1 | Example 1-2 | Example 1-3 | Example 1-4 | Example 1-5 | Example 1-6 | Example 1-7 | Example 1-8 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 100 nm | 100 nm | 100 nm | 100 nm | 100 nm | 100 nm | 100 nm | 100 nm |
| Aspect Ratio (line width 40nm : thickness) | | 1:2.5 | 1:2.5 | 1:2.5 | 1:2.5 | 1:2.5 | 1:2.5 | 1:2.5 | 1:2.5 |
| Etching Mask (EM) Film | Material | CrOCN | CrOCN | CrOCN | CrOCN | CrOC | CrOC | CrOC | CrOC |
| | Cr Content Ratio | 33 % | 33 % | 33 % | 33 % | 35 % | 35 % | 35 % | 35 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 93.1 nm | 86.2 nm | 79.3 nm | 72.4 nm | 93.1 nm | 86.2 nm | 79.3 nm | 71.9 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CDlinearity | | ◯◯ | ◯◯ | ◯◯ | ◯◯ | ◯◯ | ◯◯ | ◯◯ | ◯◯ |
| CDUniformity | | ◯◯ | ◯◯ | ◯◯ | ◯◯ | ◯◯ | ◯◯ | ◯◯ | ◯◯ |
| Resist Film Resolution (less than 40nm, resist collapse, etc.) | | ◯◯ | ◯◯ | ◯◯ | ◯◯ | ◯◯ | ◯◯ | ◯◯ | ◯◯ |
| EM Film LER (Line Edge Roughness) | | ◯◯ | ◯◯ | ◯◯ | ◯◯ | ◯◯ | ◯◯ | ◯◯ | ◯◯ |
| Resolution of DRAM hp32nm Generation (less than 40nm) | | ◯ | ◯ | ◯ | ◯ | ◯ | ◯ | ◯ | ◯ |

FIG. 4

| Example No. | | Example 1-9 | Example 1-10 | Example 1-11 | Example 1-12 | Reference Example 1-13 | Reference Example 1-14 | Reference Example 1-15 | Reference Example 1-16 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 100 nm | 100 nm | 100 nm | 100 nm | 100 nm | 100 nm | 100 nm | 100 nm |
| | Aspect Ratio (line width 40nm : thickness) | 1:2.5 | 1:2.5 | 1:2.5 | 1:2.5 | 1:2.5 | 1:2.5 | 1:2.5 | 1:2.5 |
| Etching Mask (EM) Film | Material | CrON | CrON | CrON | CrON | CrN | CrN | CrN | CrN |
| | Cr Content Ratio | 35 % | 35 % | 35 % | 35 % | 50 % | 50 % | 50 % | 50 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 93.6 nm | 87.6 nm | 81.1 nm | 74.7 nm | 92.6 nm | 85.3 nm | 77.5 nm | 70.1 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CDlinearity | | ○ | ○ | ○ | ○ | × | × | × | × |
| CDUniformity | | ○ | ○ | ○ | ○ | × | × | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 5

| Example No. | | Example 1-17 | Example 1-18 | Example 1-19 | Example 1-20 | Example 1-21 | Example 1-22 | Example 1-23 | Example 1-24 | Example 1-25 |
|---|---|---|---|---|---|---|---|---|---|---|
| Resist Film | Model No. | PRL009 | PRL009 | PRL009 | PRL009 | PRL009 | PRL009 | PRL009 | PRL009 | PRL009 |
| | Thickness | 100 nm | 100 nm | 100 nm | 100 nm | 100 nm | 100 nm | 100 nm | 100 nm | 100 nm |
| Aspect Ratio (line width 40nm : thickness) | | 1:2.5 | 1:2.5 | 1:2.5 | 1:2.5 | 1:2.5 | 1:2.5 | 1:2.5 | 1:2.5 | 1:2.5 |
| Etching Mask (EM) Film | Material | CrOCN | CrOCN | CrOCN | CrOCN | CrOCN | CrOCN | CrOCN | CrOCN | CrOCN |
| | Cr Content Ratio | 33 % | 33 % | 33 % | 33 % | 33 % | 33 % | 33 % | 33 % | 33 % |
| | Thickness | 5 nm | 5 nm | 5 nm | 5 nm | 6 nm | 5 nm | 5 nm | 5 nm | 5 nm |
| Light-Shielding Film | Total Thickness | 56 nm | 53 nm | 51 nm | 52 nm | 60 nm | 60 nm | 60 nm | 60 nm | 60 nm |
| Antireflection Layer | Material | MoSiON | MoSiON | MoSiON | MoSiON | MoSiON | MoSiON | MoSiON | MoSiON | MoSiON |
| | Thickness | 15 nm | 15 nm | 15 nm | 15 nm | 8 nm | 10 nm | 15 nm | 18 nm | 10 nm |
| Light-Shielding Layer | Material | MoSi | MoSi | MoSi | MoSi | MoSiN | MoSiN | MoSiN | MoSiN | MoSiN |
| | Mo Content | 9 % | 15 % | 33 % | 40 % | 9 % | 18 % | 30 % | 40 % | 15 % |
| | Thickness | 34 nm | 31 nm | 29 nm | 30 nm | 52 nm | 50 nm | 45 nm | 42 nm | 50 nm |
| Back-Surface Antireflection Laye | Material | MoSiON | MoSiON | MoSiON | MoSiON | | | | | |
| | Thickness | 7 nm | 7 nm | 7 nm | 7 nm | | | | | |
| Resist Film Thickness after EM Film Dry Etching | | 93.1 nm | 93.1 nm | 93.1 nm | 93.1 nm | 93.1 nm | 93.1 nm | 93.1 nm | 93.1 nm | 93.1 nm |
| EM Film Thickness after Light-Shielding Film Dry Etching | | 3.7 nm | 3.5 nm | 3.6 nm | 3.5 nm | 3.1 nm | 3.3 nm | 3.4 nm | 3.4 nm | 3.2 nm |
| CD linearity | | ○ | ○ | ○ | ○ | ○ | ○ | ○ | ○ | ○ |
| CD Uniformity | | ○ | ○ | ○ | ○ | ○ | ○ | ○ | ○ | ○ |
| Resist Film Resolution (less than 40nm, resist collapse, etc.) | | ○ | ○ | ○ | ○ | ○ | ○ | ○ | ○ | ○ |
| EM Film LER (Line Edge Roughness) | | ○ | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ | ○ |

FIG. 6

| Example No. | | Example 2-1 | Example 2-2 | Example 2-3 | Example 2-4 | Example 2-5 | Example 2-6 | Example 2-7 | Example 2-8 |
|---|---|---|---|---|---|---|---|---|---|
| Resist Film | Model No. | SLV-08 | SLV-08 | SLV-08 | SLV-08 | SLV-08 | SLV-08 | SLV-08 | SLV-08 |
| | Thickness | 100 nm | 100 nm | 100 nm | 100 nm | 100 nm | 100 nm | 100 nm | 100 nm |
| Aspect Ratio (line width 40nm : thickness) | | 1:2.5 | 1:2.5 | 1:2.5 | 1:2.5 | 1:2.5 | 1:2.5 | 1:2.5 | 1:2.5 |
| Etching Mask (EM) Film | Material | CrOCN | CrOCN | CrOCN | CrOCN | CrOC | CrOC | CrOC | CrOC |
| | Cr Content Ratio | 33 % | 33 % | 33 % | 33 % | 35 % | 35 % | 35 % | 35 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 92.2 nm | 84.4 nm | 76.6 nm | 68.8 nm | 92.2 nm | 84.4 nm | 76.6 nm | 68.3 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CD linearity | | ○ | ○ | ○ | ○ | ○ | ○ | ○ | ○ |
| CD Uniformity | | ○ | ○ | ○ | ○ | ○ | ○ | ○ | ○ |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 7

| Example No. | | Example 2-9 | Example 2-10 | Example 2-11 | Example 2-12 | Reference Example 2-13 | Reference Example 2-14 | Reference Example 2-15 | Reference Example 2-16 |
|---|---|---|---|---|---|---|---|---|---|
| Resist Film | Model No. | SLV-08 | SLV-08 | SLV-08 | SLV-08 | SLV-08 | SLV-08 | SLV-08 | SLV-08 |
| | Thickness | 100 nm | 100 nm | 100 nm | 100 nm | 100 nm | 100 nm | 100 nm | 100 nm |
| Aspect Ratio (line width 40nm : thickness) | | 1:2.5 | 1:2.5 | 1:2.5 | 1:2.5 | 1:2.5 | 1:2.5 | 1:2.5 | 1:2.5 |
| Etching Mask (EM) Film | Material | CrON | CrON | CrON | CrON | CrN | CrN | CrN | CrN |
| | Cr Content Ratio | 35 % | 35 % | 35 % | 35 % | 50 % | 50 % | 50 % | 50 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 92.7 nm | 86 nm | 78.7 nm | 71.4 nm | 91.7 nm | 83.4 nm | 74.5 nm | 66.2 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CD linearity | | ○ | ○ | ○ | ○ | × | × | × | × |
| CD Uniformity | | ○ | ○ | ○ | ○ | × | × | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 8

| Example No. | | Example 2-17 | Example 2-18 | Example 2-19 | Example 2-20 | Example 2-21 | Example 2-22 | Example 2-23 | Example 2-24 |
|---|---|---|---|---|---|---|---|---|---|
| Resist Film | Model No. | SLV-08 | SLV-08 | SLV-08 | SLV-08 | SLV-08 | SLV-08 | SLV-08 | SLV-08 |
| | Thickness | 100 nm | 100 nm | 100 nm | 100 nm | 100 nm | 100 nm | 100 nm | 100 nm |
| Aspect Ratio (line width 40nm : thickness) | | 1:2.5 | 1:2.5 | 1:2.5 | 1:2.5 | 1:2.5 | 1:2.5 | 1:2.5 | 1:2.5 |
| Etching Mask (EM) Film | Material | CrOCN | CrOCN | CrOC | CrOC | CrON | CrON | CrN | CrN |
| | Cr Content Ratio | 40 % | 45 % | 40 % | 45 % | 40 % | 45 % | 40 % | 45 % |
| | Thickness | 20 nm | 20 nm | 20 nm | 20 nm | 20 nm | 20 nm | 20 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 68.2 nm | 67.5 nm | 67.8 nm | 67.2 nm | 70.3 nm | 69.0 nm | 67.0 nm | 66.5 nm |
| EM Film Thickness after Light-Shielding Film Dry Etching | | 18.6 nm | 18.6 nm | 18.6 nm | 18.6 nm | 18.6 nm | 18.6 nm | 18.6 nm | 18.6 nm |
| CDlinearity | | ○ | ○ | ○ | ○ | ○ | ○ | ○ | ○ |
| CDUniformity | | × | × | × | × | × | × | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 9

| Example No. | | Example 3-1 | Example 3-2 | Example 3-3 | Example 3-4 | Example 3-5 | Example 3-6 | Example 3-7 | Example 3-8 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 90 nm | 90 nm | 90 nm | 90 nm | 90 nm | 90 nm | 90 nm | 90 nm |
| | Aspect Ratio (line width 40nm : thickness) | 1:2.25 | 1:2.25 | 1:2.25 | 1:2.25 | 1:2.25 | 1:2.25 | 1:2.25 | 1:2.25 |
| Etching Mask (EM) Film | Material | CrOCN | CrOCN | CrOCN | CrOCN | CrOC | CrOC | CrOC | CrOC |
| | Cr Content Ratio | 33 % | 33 % | 33 % | 33 % | 35 % | 35 % | 35 % | 35 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 83.1 nm | 76.2 nm | 69.3 nm | 62.4 nm | 83.1 nm | 76.2 nm | 69.3 nm | 61.9 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CD linearity | | ○ | ○ | ○ | ○ | ○ | ○ | ○ | ○ |
| CD Uniformity | | ○ | ○ | ○ | ○ | ○ | ○ | ○ | ○ |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 10

| Example No. | | Example 3-9 | Example 3-10 | Example 3-11 | Example 3-12 | Reference Example 3-13 | Reference Example 3-14 | Reference Example 3-15 | Reference Example 3-16 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 90 nm | 90 nm | 90 nm | 90 nm | 90 nm | 90 nm | 90 nm | 90 nm |
| | Aspect Ratio (line width 40nm : thickness) | 1:2.25 | 1:2.25 | 1:2.25 | 1:2.25 | 1:2.25 | 1:2.25 | 1:2.25 | 1:2.25 |
| Etching Mask (EM) Film | Material | CrON | CrON | CrON | CrON | CrN | CrN | CrN | CrN |
| | Cr Content Ratio | 35 % | 35 % | 35 % | 35 % | 50 % | 50 % | 50 % | 50 % |
| | Thickness | 5 nm | 10 nm | 15 nm | 20 nm | 5 nm | 10 nm | 15 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 83.6 nm | 77.6 nm | 71.1 nm | 64.7 nm | 82.6 nm | 75.3 nm | 67.5 nm | 60.1 nm |
| EM Film Thickness after Light-Shielding Film Dry Etching | | 3.6 nm | 8.6 nm | 13.6 nm | 18.6 nm | 3.6 nm | 8.6 nm | 13.6 nm | 18.6 nm |
| CDlinearity | | ○ | ○ | ○ | ○ | × | × | × | × |
| CDUniformity | | ○ | ○ | ○ | ○ | × | × | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 11

| Example No. | | Example 3-17 | Example 3-18 | Example 3-19 | Example 3-20 | Example 3-21 | Example 3-22 | Example 3-23 | Example 3-24 |
|---|---|---|---|---|---|---|---|---|---|
| Resist Film | Model No. | PRL009 | PRL009 | PRL009 | PRL009 | PRL009 | PRL009 | SLV-08 | PRL009 |
| | Thickness | 90 nm | 90 nm | 90 nm | 90 nm | 90 nm | 90 nm | 90 nm | 90 nm |
| Aspect Ratio (line width 40nm : thickness) | | 1:2.25 | 1:2.25 | 1:2.25 | 1:2.25 | 1:2.25 | 1:2.25 | 1:2.25 | 1:2.25 |
| Etching Mask (EM) Film | Material | CrOCN | CrOCN | CrOC | CrOC | CrON | CrON | CrN | CrN |
| | Cr Content Ratio | 40 % | 45 % | 40 % | 45 % | 40 % | 45 % | 40 % | 45 % |
| | Thickness | 20 nm | 20 nm | 20 nm | 20 nm | 20 nm | 20 nm | 20 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 61.9 nm | 61.3 nm | 61.5 nm | 61.0 nm | 63.7 nm | 62.5 nm | 60.8 nm | 60.3 nm |
| EM Film Thickness after Light-Shielding Film Dry Etching | | 18.6 nm | 18.6 nm | 18.6 nm | 18.6 nm | 18.6 nm | 18.6 nm | 18.6 nm | 18.6 nm |
| CDlinearity | | ○ | ○ | ○ | ○ | ○ | ○ | ○ | ○ |
| CDUniformity | | × | × | × | × | × | × | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

| Example No. | | Example 4-1 | Example 4-2 | Example 4-3 | Example 4-4 | Example 4-5 | Example 4-6 | Example 4-7 | Example 4-8 | Example 4-9 | Reference Example 4-10 |
|---|---|---|---|---|---|---|---|---|---|---|---|
| Resist Film | Model No. | PRL009 | PRL009 | PRL009 | PRL009 | PRL009 | PRL009 | PRL009 | PRL009 | PRL009 | PRL009 |
| | Thickness | 75 nm | 75 nm | 75 nm | 75 nm | 75 nm | 75 nm | 75 nm | 75 nm | 75 nm | 75 nm |
| Aspect Ratio (line width 40nm : thickness) | | 1:1.9 | 1:1.9 | 1:1.9 | 1:1.9 | 1:1.9 | 1:1.9 | 1:1.9 | 1:1.9 | 1:1.9 | 1:1.9 |
| Etching Mask (EM) Film | Material | CrOCN | CrOCN | CrOCN | CrOC | CrOC | CrOC | CrON | CrON | CrON | CrN |
| | Cr Content Ratio | 33 % | 33 % | 33 % | 35 % | 35 % | 35 % | 35 % | 35 % | 35 % | 50 % |
| | Thickness | 5 nm | 10 nm | 15 nm | 5 nm | 10 nm | 15 nm | 5 nm | 10 nm | 15 nm | 5 nm |
| Light-Shielding Film | Total Thickness | 52 nm | 52 nm | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi | MoSi | MoSi |
| | Mo Content | 21 % | 21 % | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm | 7 nm | 7 nm |
| Resist Film Thickness after EM Film Dry Etching | | 68.1 nm | 61.2 nm | 54.3 nm | 68.1 nm | 61.2 nm | 54.3 nm | 68.6 nm | 62.6 nm | 56.1 nm | 67.6 nm |
| EM Film Thickness after Light-Shielding Film Dry Etching | | 3.6 nm | 8.6 nm | 13.6 nm | 3.6 nm | 8.6 nm | 13.6 nm | 3.6 nm | 8.6 nm | 13.6 nm | 3.6 nm |
| CD linearity | | ○ | ○ | ○ | ○ | ○ | ○ | ○ | ○ | ○ | × |
| CD Uniformity | | ○ | ○ | ○ | ○ | ○ | ○ | ○ | ○ | ○ | × |
| Resist Film Resolution (less than 40nm, resist collapse, etc.) | | ○ | ○ | ○ | ○ | ○ | ○ | ○ | ○ | ○ | ○ |
| EM Film LER (Line Edge Roughness) | | ○ | ○ | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ | ○ | ○ |

| Example No. | | Reference Example 4-11 | Reference Example 4-12 | Example 4-13 | Example 4-14 | Example 4-15 | Example 4-16 | Example 4-17 | Example 4-18 | Example 4-19 | Example 4-20 |
|---|---|---|---|---|---|---|---|---|---|---|---|
| Resist Film | Model No. | PRL009 | PRL009 | PRL009 | PRL009 | PRL009 | PRL009 | PRL009 | PRL009 | PRL009 | PRL009 |
| | Thickness | 75 nm | 75 nm | 75 nm | 75 nm | 75 nm | 75 nm | 75 nm | 75 nm | 75 nm | 75 nm |
| Aspect Ratio (line width 40nm : thickness) | | 1:1.9 | 1:1.9 | 1:1.9 | 1:1.9 | 1:1.9 | 1:1.9 | 1:1.9 | 1:1.9 | 1:1.9 | 1:1.9 |
| Etching Mask (EM) Film | Material | CrN | CrN | CrOCN | CrOCN | CrOC | CrOC | CrON | CrON | CrN | CrN |
| | Cr Content Ratio | 50 % | 50 % | 40 % | 45 % | 40 % | 45 % | 40 % | 45 % | 40 % | 45 % |
| | Thickness | 10 nm | 15 nm | 15 nm | 15 nm | 15 nm | 15 nm | 15 nm | 15 nm | 15 nm | 15 nm |
| Light-Shielding Film | Total Thickness | 52 nm | 52 nm | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi | MoSi | MoSi |
| | Mo Content | 21 % | 21 % | 21 % | 21 % | 21 % | 21 % | 21 % | 21 % | 21 % | 21 % |
| Back-Surface Antireflection Layer Thickness | | 30 nm | 30 nm | 30 nm | 30 nm | 30 nm | 30 nm | 30 nm | 30 nm | 30 nm | 30 nm |
| | Material | MoSiON | MoSiON | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm | 7 nm | 7 nm |
| Resist Film Thickness after EM Film Dry Etching | | 60.3 nm | 52.5 nm | 53.9 nm | 53.4 nm | 53.6 nm | 53.3 nm | 55.3 nm | 54.4 nm | 53.1 nm | 52.7 nm |
| EM Film Thickness after Light-Shielding Film Dry Etching | | 8.6 nm | 13.6 nm | 13.6 nm | 13.6 nm | 13.6 nm | 13.6 nm | 13.6 nm | 13.6 nm | 13.6 nm | 13.6 nm |
| CD linearity | | × | × | ○ | ○ | ○ | ○ | ○ | ○ | ○ | ○ |
| CD Uniformity | | × | × | × | × | × | × | × | × | × | × |
| Resist Film Resolution (less than 40nm, resist collapse, etc.) | | ○ | ○ | ○ | ○ | ○ | ○ | ○ | ○ | ○ | ○ |
| EM Film LER (Line Edge Roughness) | | ○ | ○ | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ | ○ | ○ |

| Example No. | | Example 5-1 | Example 5-2 | Example 5-3 | Example 5-4 | Example 5-5 | Example 5-6 | Reference Example 5-7 | Reference Example 5-8 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 65 nm | 65 nm | 65 nm | 65 nm | 65 nm | 65 nm | 65 nm | 65 nm |
| | Aspect Ratio (line width 40nm : thickness) | 1:1.4 | 1:1.4 | 1:1.4 | 1:1.4 | 1:1.4 | 1:1.4 | 1:1.4 | 1:1.4 |
| Etching Mask (EM) Film | Material | CrOCN | CrOCN | CrOC | CrOC | CrON | CrON | CrN | CrN |
| | Cr Content Ratio | 33 % | 33 % | 33 % | 33 % | 33 % | 33 % | 50 % | 50 % |
| | Thickness | 5 nm | 5 nm | 5 nm | 10 nm | 5 nm | 10 nm | 5 nm | 10 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 58.1 nm | 51.2 nm | 58.1 nm | 51.2 nm | 58.6 nm | 52.6 nm | 57.6 nm | 50.3 nm |
| EM Film Thickness after Light-Shielding Film Dry Etching | | 3.6 nm | 8.6 nm | 3.6 nm | 8.6 nm | 3.6 nm | 8.6 nm | 3.6 nm | 8.6 nm |
| CDlinearity | | ○ | ○ | ○ | ○ | ○ | ○ | × | × |
| CDUniformity | | ○ | ○ | ○ | ○ | ○ | ○ | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

| Example No. | | Example 5-9 | Example 5-10 | Example 5-11 | Example 5-12 | Example 5-13 | Example 5-14 | Example 5-15 | Example 5-16 |
|---|---|---|---|---|---|---|---|---|---|
| Resist Film | Model No. | PRL009 | PRL009 | PRL009 | PRL009 | PRL009 | PRL009 | PRL009 | PRL009 |
| | Thickness | 65 nm | 65 nm | 65 nm | 65 nm | 65 nm | 65 nm | 65 nm | 65 nm |
| Aspect Ratio (line width 40nm : thickness) | | 1:1.4 | 1:1.4 | 1:1.4 | 1:1.4 | 1:1.4 | 1:1.4 | 1:1.4 | 1:1.4 |
| Etching Mask (EM) Film | Material | CrOCN | CrOCN | CrOC | CrOC | CrON | CrON | CrN | CrN |
| | Cr Content Ratio | 40 % | 45 % | 40 % | 45 % | 40 % | 45 % | 40 % | 45 % |
| | Thickness | 10 nm | 10 nm | 10 nm | 10 nm | 10 nm | 10 nm | 10 nm | 10 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 51.0 nm | 50.7 nm | 50.8 nm | 50.6 nm | 51.9 nm | 51.3 nm | 50.5 nm | 50.4 nm |
| EM Film Thickness after Light-Shielding Film Dry Etching | | 8.6 nm | 8.6 nm | 8.6 nm | 8.6 nm | 8.6 nm | 8.6 nm | 8.6 nm | 8.6 nm |
| CDlinearity | | ○ | ○ | ○ | ○ | ○ | ○ | ○ | ○ |
| CDUniformity | | × | × | × | × | × | × | × | × |
| Resist Film Resolution (less than 40nm, resist collapse, etc.) | | ○ | ○ | ○ | ○ | ○ | ○ | ○ | ○ |
| EM Film LER (Line Edge Roughness) | | ○ | ○ | ○ | ○ | ○ | ○ | ○ | ○ |
| Resolution of DRAM hp32nm Generation (less than 40nm) | | ○ | ○ | ○ | ○ | ○ | ○ | ○ | ○ |

FIG. 16

| Comparative Example No. | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Resist Film | Model No. | SLV-08 | SLV-08 | PRL009 | SLV-08 | SLV-08 | SLV-08 | SLV-08 | PRL009 |
| | Thickness | 100 nm | 100 nm | 120 nm | 120 nm | 100 nm | 100 nm | 100 nm | 100 nm |
| Aspect Ratio (line width 40nm : thickness) | | 1:2.5 | 1:2.5 | 1:3 | 1:3 | 1:2.5 | 1:2.5 | 1:2.5 | 1:2.5 |
| Etching Mask (EM) Film | Material | CrOCN | CrOCN | CrOCN | CrOCN | CrN | CrN | CrN | CrN |
| | Cr Content Ratio | 33 % | 33 % | 33 % | 33 % | 90 % | 90 % | 90 % | 90 % |
| | Thickness | 4 nm | 30 nm | 20 nm | 20 nm | 10 nm | 15 nm | 20 nm | 20 nm |
| Light-Shielding Film | Total Thickness | 52 nm | 52 nm | 52 nm | 52 nm | 52 nm | 52 nm | 52 nm | 52 nm |
| Antireflection Layer | Material | MoSiON | MoSiON | MoSiON | MoSiON | MoSiON | MoSiON | MoSiON | MoSiON |
| | Thickness | 15 nm | 15 nm | 15 nm | 15 nm | 15 nm | 15 nm | 15 nm | 15 nm |
| Light-Shielding Layer | Material | MoSi | MoSi | MoSi | MoSi | MoSi | MoSi | MoSi | MoSi |
| | Mo Content | 21 % | 21 % | 21 % | 21 % | 21 % | 21 % | 21 % | 21 % |
| | Thickness | 30 nm | 30 nm | 30 nm | 30 nm | 30 nm | 30 nm | 30 nm | 30 nm |
| Back-Surface Antireflection Layer | Material | MoSiON | MoSiON | MoSiON | MoSiON | MoSiON | MoSiON | MoSiON | MoSiON |
| | Thickness | 7 nm | 7 nm | 7 nm | 7 nm | 7 nm | 7 nm | 7 nm | 7 nm |
| Resist Film Thickness after EM Film Dry Etching | | 93.7 nm | 49.6 nm | 91.9 nm | 88.3 nm | 48.8 nm | 25.6 nm | 1.2 nm | 12.6 nm |
| EM Film Thickness after Light-Shielding Film Dry Etching | | 2.6 nm | 28.6 nm | 18.6 nm | 18.6 nm | 8.6 nm | 13.6 nm | 18.6 nm | 18.6 nm |
| CD linearity | | × | × | ○ | ○ | × | × | × | × |
| CD Uniformity | | × | × | ○ | ○ | × | × | × | × |
| Resist Film Resolution (less than 40nm, resist collapse, etc.) | | ○ | ×LER | ×collapse | ×collapse | ×LER | ×LER | ×LER | ×LER |
| EM Film LER (Line Edge Roughness) | | × | ○ | ○ | ○ | ○ | ○ | ○ | ○ |
| Resolution of DRAM hp32nm Generation (less than 40nm) | | × | × | × | × | × | × | × | × |
| Corresponding Example No. | | 1~4 | 1~4 | 4 | 4 | 13~16 | 13~16 | 13~16 | 13~16 |

FIG. 17

| Comparative Example No. | | Comparative Example 9 | Comparative Example 10 | Comparative Example 11 | Comparative Example 12 | Comparative Example 13 | Comparative Example 14 |
|---|---|---|---|---|---|---|---|
| Resist Film | Model No. | SLV-08 | SLV-08 | PRL009 | SLV-08 | PRL009 | PRL009 |
| | Thickness | 100 nm | 100 nm | 100 nm | 100 nm | 75 nm | 100 nm |
| Aspect Ratio (line width 40nm : thickness) | | 1:2.5 | 1:2.5 | 1:2.5 | 1:2.5 | 1:1.9 | 1:2.5 |
| Etching Mask (EM) Film | Material | CrN | Cr | Cr | CrOCN | CrN | CrOCN |
| | Cr Content Ratio | 60 % | 100 % | 100 % | 33 % | 90 % | 33 % |
| | Thickness | 20 nm | 20 nm | 20 nm | 5 nm | 10 nm | 5 nm |
| Light-Shielding Film | Total Thickness | 52 nm | 52 nm | 52 nm | 70 nm | 52 nm | 60 nm |
| Antireflection Layer | Material | MoSiON | MoSiON | MoSiON | MoSiON | MoSiON | MoSiON |
| | Thickness | 15 nm | 15 nm | 15 nm | 8 nm | 15 nm | 15 nm |
| Light-Shielding Layer | Material | MoSi | MoSi | MoSi | MoSiN | MoSi | MoSi |
| | Mo Content | 21 % | 21 % | 21 % | 6 % | 21 % | 8 % |
| | Thickness | 30 nm | 30 nm | 30 nm | 62 nm | 30 nm | 38 nm |
| Back-Surface Antireflection Layer | Material | MoSiON | MoSiON | MoSiON | MoSiON | MoSiON | MoSiON |
| | Thickness | 7 nm | 7 nm | 7 nm | 7 nm | 7 nm | 7 nm |
| Resist Film Thickness after EM Film Dry Etching | | 42.3 nm | 0 nm | 8 nm | 92.2 nm | 31.3 nm | 93.1 nm |
| EM Film Thickness after Light-Shielding Film Dry Etching | | 18.6 nm | 18.6 nm | 18.6 nm | 2.9 nm | 8.6 nm | 3.1 nm |
| CD linearity | | × | × | × | × | × | ○ |
| CD Uniformity | | × | × | × | × | × | ○ |
| Resist Film Resolution (less than 40nm, resist collapse, etc.) | | ×LER | ×LER | ×LER | ○ | ×LER | ○ |
| EM Film LER (Line Edge Roughness) | | ○ | ○ | ○ | × | ○ | ○ |
| Resolution of DRAM hp32nm Generation (less than 40nm) | | × | × | × | × | × | ○ |
| Corresponding Example No. | | 13~16 | 13~16 | 13~16 | 21~25 | 13~16 | 17~20 |

FIG. 18

PHOTOMASK BLANK, PHOTOMASK, METHOD OF MANUFACTURING THE SAME, AND METHOD OF MANUFACTURING A SEMICONDUCTOR DEVICE

CROSS REFERENCE TO RELATED APPLICATION

This application is a National Stage of International Application No. PCT/JP2009/005021 filed on Sep. 30, 2009, which claims priority from Japanese Patent Application No. 2008-252416, filed on Sep. 30, 2008, the contents of all of which are incorporated herein by reference in their entirety.

TECHNICAL FIELD

This invention relates to a photomask blank and a photomask for use in the manufacture of semiconductor devices or the like and to a method of manufacturing the same, and so on.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, the development of the half-pitch (hp) 32 nm generation according to the semiconductor device design rule has been progressing. This corresponds to ⅙ of a wavelength 193 nm of ArF excimer laser exposure light. In the hp32 nm and subsequent generations, only the application of the resolution enhancement technology (RET) such as the conventional phase shift method, oblique illumination method, and pupil filter method and the optical proximity correction (OPC) technique is becoming insufficient, and the hyper-NA technique (immersion lithography) and the double exposure (double patterning) technique are becoming necessary.

In the case of manufacturing a photomask having a mask pattern of a light-shielding film on a transparent substrate, when the light-shielding film (e.g. a Cr-based single-layer film or a laminated film of a plurality of Cr-based layers) is dry-etched using a resist film formed with the mask pattern as a mask, the resist film is also etched to be consumed. Therefore, the resolution when the mask pattern is transferred to the light-shielding film is lowered.

As a measure for this, it is effective to reduce the thickness of the light-shielding film. However, if the thickness of the light-shielding film is reduced, the OD value (optical density) decreases.

As a measure for the above, a method of Patent Document 1 has been proposed. This method uses, for example, a blank in which a MoSi-based light-shielding film and a Cr-based etching mask film (also serving as an antireflection film) are formed on a substrate (see the same document, paragraph [0174] etc.). Using the Cr-based etching mask film with a small thickness, the load to a resist is reduced so that a reduction in resolution when a mask pattern is transferred to the Cr-based etching mask film with the small thickness is improved. Along with this, using as an etching mask for the light-shielding film the etching mask film having higher etching selectivity than the resist with respect to the light-shielding film and having the thickness much smaller than that of the resist, an improvement in CD of a light-shielding film pattern is intended to be achieved. In this event, OD=3 of the light-shielding film is also ensured. However, it is not intended to reduce the thickness of the MoSi-based light-shielding film itself.

On the other hand, Patent Document 2 describes, as a light-shielding film having a laminated structure of MoSi-based materials, a light-shielding film having a laminated structure of a MoSiN main light-shielding layer and a MoSiON antireflection layer from the substrate side, or the like, for example.

Patent Document 1: JP-A-2007-241065
Patent Document 2: JP-A-2006-78807

DISCLOSURE OF INVENTION

Problem to be Solved by the Invention

In the case of manufacturing a photomask using a molybdenum silicide-based light-shielding film, which is adapted to the DRAM hp32 nm and subsequent generations, it is insufficient to only employ a mask manufacturing process using a conventional etching mask of a Cr-based material (selecting an etching mask only in terms of etching selectivity with respect to the light-shielding film).

Further, for the reason of ensuring the edge contrast and so on, it is becoming necessary to form a fine auxiliary pattern (Sub Resolution Assist Feature: SRAF), which does not form an image, in a resist on a wafer. In the DRAM hp32 nm and subsequent generations, there is a case where it is necessary to form SRAF with a line width of less than 40 nm on a photomask.

In order to obtain the resolution (less than 40 nm) required for a photomask for use in the DRAM hp32 nm and subsequent generations, the thickness of a resist film should be set to 100 nm or less in terms of reducing the aspect ratio of a resist pattern to prevent collapse of the resist pattern.

The present inventors have found that, in order to set the thickness of the resist film to 100 nm or less, the above-mentioned layer structure of the conventional photomask blank is insufficient and it is necessary to improve both the etching mask and the light-shielding film.

Specifically, the present inventors have found that although it is necessary to improve the structure of the etching mask film to allow the mask pattern to be transferred to the etching mask with the resist film thickness of 100 nm or less, it is insufficient to only simply reduce the thickness of the etching mask film, i.e. the etching mask film should maintain the mask pattern until an etching process for transferring the mask pattern to the underlying light-shielding film is completed, and therefore, realization is difficult with the structure of the conventional etching mask film and the structure of the conventional light-shielding film.

On the other hand, if the resist film thickness is set to 100 nm or less, LER (Line Edge Roughness) tends to increase than conventional. The present inventors have found that this is because when the etching mask film is dry-etched using the resist film formed with the mask pattern as a mask, the resist film is also etched to be consumed and, when the film thickness is smaller, degradation in pattern shape is significant so that LER when the mask pattern is transferred to the etching mask film is degraded. Further, the present inventors have found that when the line width of the resist pattern becomes less than 40 nm, the influence of consumption (film reduction) of the resist pattern due to dry etching relatively increases so that such influence cannot be ignored. The present inventors have found that, also in order to solve these problems, it is necessary to shorten the time of dry etching when transferring the mask pattern to the etching mask.

It is an object of this invention to provide a photomask blank and a photomask for a generation aiming at a resist film thickness of 100 nm or less (approximately hp32 nm or later), further at a resist film thickness of 75 nm or less (approximately hp32 nm or later), or further at a resist film thickness of 65 nm or less (approximately hp22 nm or later).

Further, it is an object of this invention to provide a photomask blank and a photomask that are applicable to the DRAM half-pitch (hp) 32 nm and subsequent generations in the semiconductor design rule.

Further, it is an object of this invention to provide a photomask blank and a photomask that can achieve a resolution of less than 40 nm of a mask pattern.

Means for Solving the Problem

This invention has the following structures.

(Structure 1)

A photomask blank for use in manufacturing a photomask adapted to be applied with exposure light having a wavelength of 200 nm or less, wherein the photomask blank comprises a transparent substrate, a light-shielding film formed on the transparent substrate and containing molybdenum and silicon, and an etching mask film formed in contact with the light-shielding film and containing chromium, and wherein the light-shielding film comprises a light-shielding layer and an antireflection layer in this order from a transparent substrate side, the light-shielding layer has a molybdenum content of 9 at % or more and 40 at % or less, and the etching mask film has a chromium content of 45 at % or less.

(Structure 2)

A photomask blank for use in manufacturing a photomask adapted to be applied with exposure light having a wavelength of 200 nm or less, wherein the photomask blank comprises a transparent substrate, a light-shielding film formed on the transparent substrate and containing molybdenum and silicon, and an etching mask film formed in contact with the light-shielding film and containing chromium, and wherein the light-shielding film comprises a light-shielding layer and an antireflection layer in this order from a transparent substrate side, the etching mask film has a chromium content of 45 at % or less, and a laminated film comprising the light-shielding film and the etching mask film has a sheet resistance value of 3.0 kΩ/square or less.

(Structure 3)

The photomask blank according to the structure 1 or 2, wherein the etching mask film has a chromium content of 35 at % or less and contains at least one of nitrogen and oxygen.

(Structure 4)

The photomask blank according to any of the structures 1 to 3, wherein the etching mask film contains carbon and at least one of nitrogen and oxygen.

(Structure 5)

The photomask blank according to any of the structures 1 to 4, wherein the etching mask film is processed using a resist film which is formed on the etching mask film and has a thickness of 100 nm or less, the etching mask film has a thickness of 5 nm or more and 20 nm or less, and the light-shielding film has a thickness of 60 nm or less.

(Structure 6)

The photomask blank according to the structure 5, wherein the resist film has a thickness of 75 nm or less, and the etching mask film has a thickness of 5 nm or more and 15 nm or less.

(Structure 7)

The photomask blank according to the structure 5, wherein the resist film has a thickness of 65 nm or less, and the etching mask film has a thickness of 5 nm or more and 10 nm or less.

(Structure 8)

The photomask blank according to any of the structures 1 to 7, wherein the light-shielding layer is formed of a material comprising molybdenum and silicon or a material comprising molybdenum, silicon, and nitrogen.

(Structure 9)

The photomask blank according to any of the structures 1 to 7, wherein the light-shielding film comprises two layers which are the light-shielding layer and the antireflection layer, the light-shielding layer is formed of a material comprising molybdenum, silicon, and nitrogen, and the antireflection layer is formed of a material comprising molybdenum, silicon, and at least one of oxygen and nitrogen.

(Structure 10)

The photomask blank according to any of the structures 1 to 9, wherein the etching mask film is a film which is removed when a photomask is manufactured.

(Structure 11)

The photomask blank according to any of the structures 1 to 10, wherein the photomask blank has a resist film formed on the etching mask film.

(Structure 12)

A photomask manufactured using the photomask blank according to any of the structures 1 to 11.

(Structure 13)

A method of manufacturing a photomask, comprising preparing the photomask blank according to any of the structures 1 to 11, using as a mask a resist pattern formed on the etching mask film, dry-etching the etching mask film using a chlorine-based gas containing oxygen to thereby carry out pattern transfer, using as a mask a pattern formed in the etching mask film, dry-etching the light-shielding film using a fluorine-based gas to thereby carry out pattern transfer, and carrying out dry etching using a chlorine-based gas containing oxygen after the pattern transfer to the light-shielding film, thereby removing the etching mask film.

(Structure 14)

A semiconductor device manufacturing method of manufacturing a semiconductor device by transferring a pattern of the photomask according to the structure 12.

Effect of the Invention

According to this invention, by setting the chromium content of an etching mask film made of a material with a high etching rate and setting the molybdenum content of a light-shielding film made of a material having high light-shielding performance and capable of ensuring conductivity, so as to simultaneously satisfy a plurality of conditions that even if the resist film thickness is 100 nm or less, further the resist film thickness is 75 nm or less, or further the resist film thickness is 65 nm or less, the influence of LER of a resist pattern is small, the influence of LER of an etching mask pattern is small, and the light-shielding film has predetermined or more light-shielding performance, it is possible to provide a photomask blank and a photomask that can satisfy the resolution (less than 40 nm) required for the DRAM half-pitch (hp) 32 nm and subsequent generations in the semiconductor design rule and that can also prevent collapse of the resist pattern.

The DRAM half-pitch (hp) 32 nm in this invention is based on 2008 ITRS (International Technology Roadmap for Semiconductors). This invention is applicable not only to DRAM, but also to a flash memory and MPU.

Hereinbelow, this invention will be described in detail.

A photomask blank according to this invention is for use in manufacturing a photomask adapted to be applied with exposure light having a wavelength of 200 nm or less, and is characterized by comprising: a transparent substrate, a light-shielding film formed on the transparent substrate and containing molybdenum and silicon, and an etching mask film formed in contact with the light-shielding film and containing chromium, and the light-shielding film comprising a light-shielding layer and an antireflection layer in this order from a transparent substrate side, the light-shielding layer having a molybdenum content of 9 at % or more and 40 at % or less, and the etching mask film having a chromium content of 45 at % or less (Structure 1).

Further, a photomask blank according to this invention is for use in manufacturing a photomask adapted to be applied with exposure light having a wavelength of 200 nm or less, and is characterized by comprising:

a transparent substrate, a light-shielding film formed on the transparent substrate and containing molybdenum and silicon, and an etching mask film formed in contact with the light-shielding film and containing chromium, and the light-shielding film comprising a light-shielding layer and an antireflection layer in this order from a transparent substrate side, the etching mask film having a chromium content of 45 at % or less, and a laminated film comprising the light-shielding film and the etching mask film having a sheet resistance value of 3.0 k$\Omega$/square or less (Structure 2).

The present inventors have found that when processing is carried out using a mask blank comprising a MoSi-based light-shielding film, a Cr-based etching mask film, and a resist film (thickness 100 nm or less) in this order (in contact with each other) on a transparent substrate, (1) there is a case where LER of a resist pattern cannot be reduced only by simply reducing the thickness of the etching mask film (e.g. to 20 nm or less), (2) in terms of reducing LER of the resist pattern, a material with a large amount of the Cr component is not preferable as the Cr-based etching mask film because the etching rate is low in chlorine-based (e.g. $Cl_2+O_2$) dry etching and thus, from this point of view, a highly nitrided (nitriding degree is high) and/or highly oxidized (oxidation degree is high) Cr-based material with a small amount of the Cr component is preferable as the Cr-based etching mask film, (3) in terms of reducing LER of a Cr-based etching mask film pattern, a material with a large amount of the Cr component is preferable as the Cr-based etching mask film because the etching rate is low in fluorine-based dry etching and thus, from this point of view, a Cr-based material with a large amount of the Cr component is preferable as the Cr-based etching mask film, and (4) (2) and (3) described above are in a trade-off relationship and, taking this into account, the content of chromium in the Cr-based etching mask film is preferably 50 at % or less, further preferably 45 at % or less, and more preferably 35 at % or less, and the lower limit of the content of chromium in the Cr-based etching mask film is preferably 20 at % or more and further preferably 30 at % or more and, particularly in the case of the etching mask film being a chromium oxide film, it is preferably 33 at % or more.

A description will be given in detail paying attention to the chromium content of the Cr-based etching mask film.

In recent years, in order to form a fine pattern, electron beam writing exposure by the use of an electron beam writing apparatus with a high current density of, for example, 200 A/cm$^2$ or more is employed using an electron beam writing resist film as a resist film. In such electron beam writing exposure, a thin film under the resist film should have conductivity for preventing charge-up. Therefore, in a mask blank having a structure in which a Cr-based etching mask film is provided on a MoSi-based light-shielding film, one of the MoSi-based light-shielding film and the Cr-based etching mask film should have conductivity. In the case of ensuring the conductivity using the Cr-based etching mask film, it is considered to use a film with a high chromium content as the Cr-based etching mask film. In this structure, in a thin film in the form of a laminated film comprising the light-shielding film and the etching mask film located under the resist film, the conductivity is ensured by the upper etching mask film and, simultaneously, the resistance to fluorine-based etching can be increased to make LER of the etching mask film good as described above at (3).

However, in a structure where the chromium content is 50 at % or more, the etching rate becomes low so that the resist film is reduced in amount during dry etching of the Cr-based etching mask film, and therefore, the resist film should be made thick. As a result, the aspect ratio (1:2.5) of a resist pattern, i.e. a transfer pattern, particularly at an SRAF portion of less than 40 nm increases so that collapse or lack tends to occur, and therefore, it is not possible to obtain a photomask having a resolution suitable for a fine pattern of the DRAM hp32 nm and subsequent generations.

In this invention, the Cr-based etching mask film is made of a material with a small amount of the Cr component such that the chromium content is 50 at % or less, to thereby increase the etching rate while the conductivity is ensured by the MoSi-based light-shielding film to ensure the conductivity of the thin film under the resist film. Specifically, in electron beam writing exposure, in order to set the position accuracy error to 0.1 nm or less, a sheet resistance value should be set to 3.0 k$\Omega$/square or less. That is, by forming a light-shielding layer in the light-shielding film of a material containing molybdenum and silicon and having a molybdenum content of 9 at % or more, the conductivity of the thin film under the resist film is ensured by the lower light-shielding film, while, by setting the chromium content of the Cr-based etching mask film to 50 at % or less, the etching rate of the Cr-based etching mask film is made high. As a consequence, it is possible to set the thickness of the resist film to 100 nm or less and to improve LER of the resist film.

Upon etching the Cr-based etching mask film, the entrance of chloride ions is hindered as the aspect ratio of the resist pattern increases (pattern pitch decreases). Therefore, a microloading phenomenon occurs due to the difference in etching rate between patterns having different aspect ratios.

In view of this, in this invention, the etching rate is made high by setting the content of chromium in the etching mask film to 45 at % or less. As a consequence, it is possible to reduce the difference in etching rate between patterns having different aspect ratios and thus to suppress the microloading phenomenon. As a result, it is possible to prevent degradation of the CD linearity.

The photomask blank in this invention has a structure in which the light-shielding film comprises a light-shielding layer and an antireflection layer in this order from the transparent substrate side. When manufacturing a photomask using this photomask blank, since the light-shielding film has the antireflection function, the etching mask film on the light-shielding film is finally stripped. That is, the structure of the photomask in this invention is formed by a light-shielding film pattern comprising the light-shielding layer and the antireflection layer. In this event, if the chromium content of the etching mask film is 35 at % or less, when the etching mask film is stripped by dry etching using a mixed gas of $Cl_2$ and $O_2$, the etching rate can be made high so that the etching mask film is easily stripped, and therefore, it is possible to prevent degradation of the CD uniformity.

According to the above, the photomask blank in this invention is such that the chromium content of the Cr-based etching mask film and the molybdenum content of the light-shielding layer are selected by synthetically considering the factors such as, in addition to ensuring the conductivity of the film and the good etching selectivity with respect to the MoSi-based film, LER of the Cr-based etching mask film and the resist film, the resolution of the resist film, the improvement in CD linearity by suppressing the microloading phenomenon, and the improvement in CD uniformity by quick stripping of the Cr-based etching mask film.

(5) In relation to (2) and (4) described above (i.e. in relation to shortening the etching time of the Cr-based etching mask film), the thickness of the Cr-based etching mask film is preferably 20 nm or less in terms of reducing LER (Line Edge Roughness) of the resist pattern.

(6) In relation to (3) and (4) described above (i.e. in relation to the etching resistance of the Cr-based etching mask film), since the etching mask should maintain the mask pattern until an etching process for transferring the mask pattern to the underlying light-shielding film is completed, the thickness of the Cr-based etching mask film is preferably 5 nm or more.

(7) The Cr-based material has high etching selectivity for a fluorine-based gas with respect to the MoSi-based material. However, since the Cr-based material is not a little subjected to the physical etching influence during etching with the fluorine-based gas and thus is more or less reduced in amount. Accordingly, the present inventors have found that even if the Cr-based etching mask film is optimized, when the thickness of the MoSi-based light-shielding film exceeds 60 nm, the etching time of dry etching with the fluorine-based gas is prolonged so that the thickness of the Cr-based etching mask film after this dry etching is reduced and thus LER (Line Edge Roughness) of a Cr-based etching mask film pattern is degraded, and therefore, the thickness of the MoSi-based light-shielding film is preferably 60 nm or less.

The present inventors have found that in the case where a light-shielding layer is a MoSi film made of a material substantially comprising molybdenum and silicon and having a molybdenum content of 9 at % or more and 40 at % or less, as shown in FIG. 19, it is possible to obtain the light-shielding layer having a high optical density per unit thickness and having a relatively high light-shielding property for ArF excimer laser exposure light, that even if the thickness of the light-shielding layer is less than 40 nm which is much smaller than conventional, the predetermined light-shielding property (optical density) is obtained, and further that, by combining it with an antireflection layer and a low reflection layer each having a light-shielding property equal to conventional, a light-shielding property (optical density 2.8 or more, preferably 3 or more) sufficient for a light-shielding film of a photomask for ArF excimer laser exposure is obtained.

When the content of molybdenum in the light-shielding layer in the form of the MoSi film is 9 at % or more, the optical density per unit thickness can be set to $\Delta OD=0.075$ $nm^{-1}@193.4$ nm or more. If the molybdenum content is 15 at % or more, it can be set to $\Delta OD=0.08$ $nm^{-1}@193.4$ nm or more, which is thus more preferable. If the molybdenum content is 20 at % or more, it can be set to $\Delta OD=0.082$ $nm^{-1}@193.4$ nm or more, which is thus further preferable.

The content of molybdenum in the light-shielding layer in the form of the MoSi film is preferably 15 at % or more and 40 at % or less, and more preferably 20 at % or more and 40 at % or less.

Further, the present inventors have found that in the case where a light-shielding layer is a MoSiN film made of a material substantially comprising molybdenum, silicon, and nitrogen and having a molybdenum content of 9 at % or more and 40 at % or less, by adjusting the nitrogen content, as shown in FIG. 20, it is possible to obtain the light-shielding layer having a high optical density per unit thickness and having a relatively high light-shielding property for ArF excimer laser exposure light, that even if the thickness of the light-shielding layer is 55 nm or less, the predetermined light-shielding property (optical density) is obtained, and further that, by combining it with a front-surface antireflection layer having a light-shielding property equal to conventional, a light-shielding property (optical density 2.8 or more, preferably 3 or more) sufficient for a light-shielding film of a photomask for ArF excimer laser exposure is obtained.

In FIG. 20, the Mo contents and the nitrogen contents of light-shielding layers whose optical densities per unit thickness are predetermined values ($\Delta OD=0.05$ $nm^{-1}$, $0.06$ $nm^{-1}$, $0.07$ $nm^{-1}$, $0.075$ $nm^{-1}$) are plotted and approximate curves are drawn. In FIG. 20, for example, an area under the approximate curve of $\Delta OD=0.06$ $nm^{-1}$, including the plots, represents an area where a light-shielding layer having an optical density of 0.06 $nm^{-1}$ or more can be formed. Further, the Mo contents and the nitrogen contents of light-shielding layers, each in a laminated film comprising a light-shielding film and an etching mask film and having a sheet resistance value of 3.0 $k\Omega$/square, are also plotted and an approximate straight line is drawn. Herein, the thicknesses of an antireflection layer of the light-shielding film and the etching mask film in each laminated film are set to fixed values, respectively. An area on the right side of the approximate straight line, including the plots, represents an area where a light-shielding layer having a sheet resistance value of 3.0 $k\Omega$/square or less can be formed.

From FIG. 20, when the molybdenum content is 9 at % or more and the nitrogen content is less than 40 at %, $\Delta OD$ of the light-shielding layer can be set greater than 0.05 $nm^{-1}$ and the light-shielding layer can be set to 55 nm or less. In the case of the light-shielding layer with $\Delta OD$ being 0.06 $nm^{-1}$ or more, the thickness of the light-shielding layer can be set to 50 nm or less by setting the nitrogen content to 36 at % or less. In the case of the light-shielding layer with $\Delta OD$ being 0.07 $nm^{-1}$ or more, the thickness of the light-shielding layer can be set to 43 nm or less by setting the nitrogen content to 25 at % or less. In the case of the light-shielding layer with $\Delta OD$ being 0.075 nm$^{-1}$ or more, the thickness of the light-shielding layer can be set to 40 nm or less by setting the nitrogen content to 14 at % or less.

In order to ensure the sheet resistance value of the laminated film comprising the light-shielding film and the etching mask film, in the case of the light-shielding layer with ΔOD being greater than 0.05 nm$^{-1}$, the molybdenum content is preferably higher than 25 at %, in the case of the light-shielding layer with ΔOD being 0.06 nm$^{-1}$ or more, the molybdenum content is preferably 24 at % or more, in the case of the light-shielding layer with ΔOD being 0.07 nm$^{-1}$ or more, the molybdenum content is preferably 17 at % or more, and in the case of the light-shielding layer with ΔOD being 0.075 nm$^{-1}$ or more, the molybdenum content is preferably 9 at % or more.

The light-shielding layer in the form of the MoSi film or the MoSiN film has a problem that when the molybdenum content is high, the chemical resistance and the cleaning resistance (particularly, alkaline cleaning or hot water cleaning) decrease. Therefore, the content of molybdenum in the MoSi film or the MoSiN film is preferably set to 40 at % or less which is the content that can ensure the required minimum chemical resistance and cleaning resistance when used as a photomask. As is also clear from FIGS. 19 and 20, while increasing the molybdenum content, the light-shielding performance of the light-shielding layer in the form of the MoSi film or the MoSiN film reaches a predetermined upper limit value. Since molybdenum is a rare metal, the molybdenum content is preferably set to 40 at % or less also in terms of the cost.

According to the above-mentioned structure of this invention, i.e. the structure in which the light-shielding layer is the MoSi film or the MoSiN film and the molybdenum content is 9 at % or more and 40 at % or less, the following functions and effects are obtained.

(A) The following functions and effects are obtained by the reduction in thickness of the light-shielding layer (reduction in thickness of a transfer pattern due to the reduction in thickness of the light-shielding film).

a) It is possible to achieve prevention of transfer pattern collapse in mask cleaning.

b) With the reduction in thickness of the light-shielding layer, the side wall height of the transfer pattern is also reduced and, therefore, the pattern accuracy particularly in the side wall height direction is improved so that the CD accuracy (particularly the linearity) can be enhanced.

c) With respect to a photomask particularly for use in the hyper-NA (immersion) generation, it is necessary to reduce the thickness of a transfer pattern (reduce the side wall height of a mask pattern) as a shadowing measure and this requirement can be satisfied.

(B) When the Mo content of the light-shielding layer is within the scope of this invention, the following functions and effects are obtained.

1) As compared with the composition which falls outside the scope of this invention, the etching rate is relatively high in dry etching using a fluorine-based gas.

2) As compared with a case where the Mo content of the light-shielding layer is less than 9 at %, it is possible to ensure conductivity which is necessary in electron beam writing exposure.

In this invention, the etching mask film preferably contains, in addition to chromium, carbon and at least one of nitrogen and oxygen (Structure 4). When carbon is contained in the etching mask film, it is possible to increase the etching resistance upon etching the light-shielding film using the fluorine-based gas. This invention is configured such that the conductivity is obtained by the light-shielding film. By causing carbon to be contained in the etching mask film, the conductivity of the etching mask film can also be increased so that the sheet resistance value of the entire thin film can be further reduced. The carbon content of the etching mask film is preferably 5 at % or more and 20 at % or less. When carbon is 20 at % or less, it is possible to obtain an etching rate required for the etching mask film in this invention.

In this invention, the etching mask film preferably has a chromium content of 35 at % or less and contains at least one of nitrogen and oxygen (Structure 3). A Cr-based material is improved in etching rate for a chlorine-based gas as oxidation proceeds. Further, although not comparable with the oxidation, it is also improved in etching rate for the chlorine-based gas as nitridation proceeds. Therefore, it is preferable to highly oxidize and/or highly nitride the etching mask film in addition to setting the chromium content of the etching mask film to 35 at % or less. The total content of oxygen and nitrogen in the etching mask film is preferably 40 at % or more and more preferably 50 at % or more. When the total content of oxygen and nitrogen in the etching mask film is 40 at % or more, the required CD uniformity can be easily obtained.

When a Cr-based material film is dry-etched using a resist pattern as a mask, a global loading phenomenon occurs due to the difference in density of the transfer pattern. When forming the resist pattern, in a region, where the resist coverage is high, on the Cr-based material film (a region where the exposure ratio of the Cr-based material film is low, for example, a region where the pattern is relatively coarse), there is a tendency that the consumption of oxygen plasma in an etching gas becomes relatively large due to reasons such as a high consumption ratio at the resist so that the etching rate of the Cr-based material film becomes relatively low. On the other hand, in a region, where the resist coverage is low, on the Cr-based material film (a region where the exposure ratio of the Cr-based material film is high, for example, a region where the pattern is relatively dense), there is a tendency that the consumption of oxygen plasma in the etching gas becomes relatively small so that the etching rate of the Cr-based material film becomes relatively high. This phenomenon is a common problem for Cr-based material films and shall apply also to the Cr-based etching mask film.

When a photomask having a transfer pattern with a large difference in density is manufactured using a photomask blank having a Cr-based etching mask film on an upper surface of a light-shielding film, this global loading phenomenon appears remarkably. As a consequence, the CD uniformity of a transfer pattern of the etching mask film is degraded and, therefore, the CD uniformity of a transfer pattern of the light-shielding film which is formed by etching using the transfer pattern of the etching mask film as a mask is also degraded. In order to reduce this global loading phenomenon, it is possible to control the occurrence of the difference in etching rate by causing oxygen to be contained in a large amount in the Cr-based etching mask film. By setting the content of oxygen in the etching mask film to 20 at % or more, the global loading phenomenon can be reduced and, if it is 30 at % or more, the effect is significant. The etching mask film is preferably formed of a material composed mainly of one of chromium oxycarbonitride (CrOCN), chromium oxycarbide (CrOC), chromium oxynitride (CrON), and chromium nitride (CrN). In terms of being excellent in film defect quality, chromium oxycarbonitride or chromium oxycarbide is preferable. Further, in terms of stress controllability (low-stress film can be formed), chromium oxycarbonitride (CrOCN) is preferable.

As a film structure of the etching mask film, use is often made of a single layer made of the above-mentioned film material, but use can also be made of a plural-layer structure. In the case of the plural-layer structure, it is possible to use a plural-layer structure formed with different compositions stepwise or a film structure in which the composition changes continuously.

In this invention, the etching mask film is preferably chromium oxycarbonitride or chromium oxycarbide and is preferably formed under the conditions near the start of transition from a metallic mode to a reactive mode or under the conditions close to the reactive mode, using a chromium target and using a mixed gas containing at least "$CO_2$ gas, $N_2$ gas, and noble gas" or "$CO_2$ gas and noble gas" (selecting a gas series with a small hysteresis).

This is because a film with a high etching rate can be stably manufactured by DC sputtering.

Specifically, as shown in FIG. 3, the relationship between the voltage [V] (corresponding to the film forming rate) on the ordinate axis and the flow rate of each gas shown on the abscissa axis is examined in DC sputtering in the state where a plasma is formed.

When the flow rate of the gas shown on the abscissa axis is increased from 0 to 50 sccm (going path) and when it is decreased from 50 to 0 sccm (return path), the paths do not coincide with each other, thus showing a so-called hysteresis.

The metallic mode represents a region where high voltage (e.g. 330 to 350V) is maintained (a region where Cr is ion-sputtered by Ar), the transition region represents a region where the voltage drops rapidly, and the reactive mode represents a region after the voltage drops rapidly (a region where a voltage of 290 to 310V after the rapid drop is maintained) (a region where the gas is activated to show reactivity).

The metallic mode is a region of 0 to 30 sccm in FIG. 3(1), a region of 0 to 25 sccm in FIG. 3(2), and a region of 0 to 32 sccm in FIG. 3(3).

The transition region is a region of 35 to 50 sccm in the increase mode in FIG. 3(1), a region of 35 to 50 sccm in the increase mode in FIG. 3(2), and a region of 43 to 50 sccm in the increase mode in FIG. 3(3).

The reactive mode is a region of 50 to 35 sccm in the decrease mode in FIG. 3(1), a region of 50 to 35 sccm in the decrease mode in FIG. 3(2), and a region of 48 to 32 sccm in the decrease mode in FIG. 3(3).

In the metallic mode, a film of chromium with a very low oxidation degree and/or a very low nitriding degree is formed. In the reactive mode, a film of chromium with a high oxidation degree and/or a high nitriding degree is formed. The mode between the metallic mode and the reactive mode (the transition region between the metallic mode and the reactive mode) is not normally used because the conditions are not stable.

There are various gas series adapted to oxidize and/or nitride chromium. However, as shown in FIG. 3(3), when a gas series (NO gas+noble gas) with a large hysteresis is used, it is difficult to stably form a film of oxidized and/or nitrided chromium with few defects in the reactive mode by DC sputtering. This is the same when $O_2$ gas+noble gas is used.

On the other hand, as shown in FIG. 3(1) or FIG. 3(2), when a gas series with a small hysteresis is used ("$CO_2$ gas+noble gas" is used in FIG. 3(1) while "$CO_2$ gas+$N_2$ gas+noble gas" is used in FIG. 3(2)), it is possible to stably form a film of oxidized and/or nitrided chromium with few defects in the reactive mode (a decrease-mode region of 40 to 30 sccm in FIG. 3(1) and a decrease-mode region of 35 to 25 sccm in FIG. 3(2)) by DC sputtering, and further, the obtained oxidized and/or nitrided chromium can form a high etching rate film. Particularly, by carrying out the film formation at a portion (conditions) around a flow rate of 35 sccm, where the increase mode and the decrease mode are slightly offset from each other, in FIG. 3(1) or FIG. 3(2), i.e. under the conditions on the way of transition from the metallic mode to the reactive mode (conditions near (just before) the start of transition from the metallic mode to the reactive mode), an oxidized and/or nitrided chromium film with a relatively high etching rate as compared with other conditions can be stably manufactured with few defects by DC sputtering.

This invention includes an aspect in which the etching mask film is processed using a resist film which is formed on the etching mask film and has a thickness of 100 nm or less,
the etching mask film has a thickness of 5 nm or more and 20 nm or less, and
the light-shielding film has a thickness of 60 nm or less (Structure 5).

This is because, in relation to (2) and (4) described above (i.e. in relation to shortening the etching time of the Cr-based etching mask film), in terms of reducing LER of a resist pattern, when the thickness of the resist film is 100 nm or less, the thickness of the Cr-based etching mask film is preferably 5 nm or more and 20 nm or less and the thickness of the light-shielding film is preferably 60 nm or less.

This invention includes an aspect in which the resist film has a thickness of 75 nm or less, and
the etching mask film has a thickness of 5 nm or more and 15 nm or less (Structure 6).

This is because, in relation to (2) and (4) described above (i.e. in relation to shortening the etching time of the Cr-based etching mask film), in terms of reducing LER of a resist pattern, when the thickness of the resist film is 75 nm or less, the thickness of the Cr-based etching mask film is preferably 5 nm or more and 15 nm or less.

This invention includes an aspect in which the resist film has a thickness of 65 nm or less, and
the etching mask film has a thickness of 5 nm or more and 10 nm or less (Structure 7).

This is because, in relation to (2) and (4) described above (i.e. in relation to shortening the etching time of the Cr-based etching mask film), in terms of reducing LER of a resist pattern, when the thickness of the resist film is 65 nm or less, the thickness of the Cr-based etching mask film is preferably 5 nm or more and 10 nm or less.

This invention includes an aspect in which the light-shielding layer is formed of a material comprising molybdenum and silicon or a material comprising molybdenum, silicon, and nitrogen (Structure 8).

This invention includes an aspect in which the light-shielding film comprises at least three layers that are, from the transparent substrate side, a low reflection layer, a light-shielding layer formed in contact with the low reflection layer, and an antireflection layer formed in contact with the light-shielding layer,
the light-shielding layer is made of a material comprising molybdenum and silicon with a molybdenum content of 9 at % or more and 40 at % or less,
the antireflection layer is made of a material containing molybdenum, silicon, and at least one of oxygen and nitrogen, and
the low reflection layer is made of a material containing molybdenum, silicon, and at least one of oxygen and nitrogen.

With the structure described above, the antireflection (e.g. 30% or less) is achieved on the front side and the back side (transparent substrate side) of the light-shielding film.

In this invention, the light-shielding layer comprising molybdenum and silicon (MoSi film) represents a light-shielding layer substantially composed of molybdenum and silicon (including a metallic film substantially free of oxygen, nitrogen, etc. and a film made of a molybdenum silicide metal). This case of being substantially free of oxygen and nitrogen includes an aspect in which these elements are contained in a range capable of obtaining the functions and effects of this invention (oxygen and nitrogen are each less than 5 at % with respect to the components in the light-shielding layer). Properly speaking, in terms of the light-shielding performance, it is preferable not to contain these elements in the light-shielding layer. However, since these elements are often incorporated as impurities at the stage of film forming processes, photomask manufacturing processes, or the like, the incorporation of such elements is allowed within a range not substantially affecting a reduction in light-shielding performance. Further, other elements (carbon, helium, hydrogen, argon, xenon, etc.) may be contained in the light-shielding layer in the form of the MoSi film within a range not impairing the properties and the functions and effects described above.

In this invention, the thickness of the light-shielding layer in the form of the MoSi film is preferably 24 nm or more and more preferably 27 nm or more. On the other hand, the thickness of the layer is preferably less than 40 nm and more preferably 35 nm or less. Further, in order to ensure the conductivity by the light-shielding film, the ratio of the light-shielding layer occupying the light-shielding film is preferably 0.4 or more and 0.6 or less.

This invention includes an aspect in which the light-shielding film comprises two layers that are, from the transparent substrate side, a light-shielding layer and an antireflection layer formed in contact with the light-shielding layer, the light-shielding layer is made of a material comprising molybdenum, silicon, and nitrogen with a molybdenum content of 9 at % or more and 40 at % or less, and the antireflection layer is made of a material containing molybdenum, silicon, and at least one of oxygen and nitrogen (Structure 9).

With the structure described above, the antireflection (e.g. 30% or less) is achieved on the front side and the back side (transparent substrate side) of the light-shielding film.

In this invention, the light-shielding layer comprising molybdenum, silicon, and nitrogen (MoSiN film) represents a light-shielding layer substantially composed of molybdenum, silicon, and nitrogen (including a film made of a molybdenum silicide compound). For the same reason as that for the above-mentioned MoSi film, the case where the film is substantially free of oxygen includes an aspect in which oxygen is contained in a range capable of obtaining the functions and effects of this invention (the oxygen component is less than 5 at % in the light-shielding layer). Further, other elements (carbon, helium, hydrogen, argon, xenon, etc.) may be contained in the light-shielding layer in the form of the MoSiN film within a range not impairing the properties and the functions and effects described above.

When the light-shielding layer contains nitrogen, the light-shielding film can have the two-layer structure by giving a back-surface antireflection function to the light-shielding layer. Further, the etching rate of the light-shielding layer can be reduced as compared with the MoSi film, i.e. the light-shielding layer free of nitrogen. Therefore, as compared with the light-shielding film of the three-layer structure having the light-shielding layer in the form of the MoSi film, the difference in etching rate between the antireflection layer and the light-shielding layer can be reduced and thus the cross-sectional shape of a pattern can be made better. The content of nitrogen in the MoSiN film is preferably less than 40 at %. When the nitrogen content is less than 40 at %, the thickness of the light-shielding layer can be made small so that the light-shielding film can be set to 60 nm or less.

In this invention, the thickness of the light-shielding layer in the form of the MoSiN film is preferably 36 nm or more and more preferably 42 nm or more. On the other hand, the thickness of the layer is preferably 55 nm or less and more preferably 52 nm or less. Further, in order to ensure the conductivity by the light-shielding film, the ratio of the light-shielding layer in the form of the MoSiN film occupying the light-shielding film is preferably 0.6 or more and 0.9 or less.

In this invention, the light-shielding layer is freely controllable in tensile stress and compressive stress by the Ar gas pressure and/or the He gas pressure and a heat treatment. For example, by controlling the film stress of the light-shielding layer to be a tensile stress, it is possible to achieve balance with the compressive stress of the antireflection layer (e.g. MoSiON). That is, it is possible to cancel the stresses of the respective layers forming the light-shielding film and thus to reduce the film stress of the light-shielding film as much as possible (to substantially zero).

The antireflection layer in this invention contains molybdenum, silicon, and at least one of oxygen and nitrogen. As the antireflection layer, there can be cited MoSiON, MoSiO, MoSiN, MoSiOC, MoSiOCN, or the like. Among them, MoSiO or MoSiON is preferable in terms of the chemical resistance and the heat resistance while MoSiON is preferable in terms of the blank defect quality.

In this invention, if Mo is increased in amount in MoSiON, MoSiO, MoSiN, MoSiOC, MoSiOCN, or the like being the antireflection layer, the cleaning resistance, particularly the resistance to alkali (aqueous ammonia, etc.) or hot water, decreases. From this point of view, it is preferable to minimize Mo in MoSiON, MoSiO, MoSiN, MoSiOC, MoSiOCN, or the like being the antireflection layer.

It has been found that, upon carrying out a heat treatment (annealing) at a high temperature for the purpose of stress control, if the Mo content is high, a phenomenon that a film surface is clouded white (becomes cloudy) occurs. This is considered to be because MoO is precipitated on the surface. In terms of avoiding such a phenomenon, the content of Mo in MoSiON, MoSiO, MoSiN, MoSiOC, MoSiOCN, or the like being the antireflection layer is preferably less than 10 at %. However, if the Mo content is too low, abnormal discharge becomes significant in DC sputtering so that the defect occurrence frequency increases. Therefore, it is preferable to contain Mo in a range capable of carrying out sputtering normally. According to another film forming technique, there is a case where the film formation is enabled without containing Mo.

In this invention, since the Mo content is preferably lower in terms of the cleaning resistance and the heat treatment described above, the content ratio of molybdenum to silicon in the antireflection layer is preferably 1:6 or more, further preferably 1:16 or more, and more preferably 1:20 or more.

Further, it has been found that when a photomask is used repeatedly, a modified layer is formed on the light-shielding film due to reactions of Si and Mo forming the light-shielding film with ozone ($O_3$) produced by reactions of oxygen ($O_2$) and water ($H_2O$) in the atmosphere or oxygen ($O_2$) in the atmosphere with ArF excimer laser light, and so on. Therefore, in order to minimize the Mo content of the light-shielding film also in terms of the light fastness, the content ratio of molybdenum to silicon in the antireflection layer is preferably as described above.

In order to obtain a predetermined surface reflectance, the antireflection layer is preferably oxidized. In this case, however, there is a tendency that the etching time of the antireflection layer is prolonged. Therefore, by reducing the Mo content of the antireflection layer, it is possible to shorten the etching time of the antireflection layer when the light-shielding film is etched using the Cr-based etching mask film as a mask.

Further, when the antireflection layer contains nitrogen and/or oxygen, the total content of nitrogen and oxygen is 30 at % or more and preferably 45 at % or more. In terms of reducing the thickness of the entire light-shielding film, the total content of nitrogen and oxygen in the antireflection layer is preferably 60 at % or less.

In this invention, the thickness of the antireflection layer is preferably 5 nm to 20 nm and more preferably 7 nm to 15 nm.

In this invention, it is preferable the etching mask film is a film which is removed when a photomask is manufactured (Structure 10). Since the light-shielding film itself has the antireflection function, when a photomask is manufactured, the etching mask film on the light-shielding film can be finally stripped.

In this invention, for dry-etching the Cr-based etching mask film, it is preferable to use a dry etching gas in the form of a chlorine-based gas or in the form of a mixed gas containing a chlorine-based gas and an oxygen gas. This is because if the Cr-based etching mask film made of the material containing chromium and the elements such as oxygen and/or nitrogen is dry-etched using the above-mentioned dry etching gas, it is possible to increase the dry etching rate and thus to shorten the dry etching time so that a light-shielding film pattern with an excellent cross-sectional shape can be formed. As the chlorine-based gas for use as the dry etching gas, there can be cited, for example, $Cl_2$, $SiCl_4$, HCl, $CCl_4$, $CHCl_3$, or the like.

In this invention, for dry-etching the MoSi-based light-shielding film, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

In this invention, as the substrate, there can be cited a synthetic quartz substrate, a $CaF_2$ substrate, a soda-lime glass substrate, an alkali-free glass substrate, a low thermal expansion glass substrate, an aluminosilicate glass substrate, or the like.

The photomask blank according to this invention includes an aspect in which has a resist film formed on the etching mask film (Structure 11).

A photomask according to this invention is manufactured using the photomask blank according to the above-mentioned invention (Structure 12).

As a consequence, the same effects as those described with respect to the above-mentioned Structures 1 to 10 can be obtained.

A method of manufacturing a photomask according to this invention comprises:

preparing the photomask blank according to the above-mentioned invention, using as a mask a resist pattern formed on the etching mask film, dry-etching the etching mask film using a chlorine-based gas containing oxygen to thereby carry out pattern transfer, using as a mask a pattern formed in the etching mask film, dry-etching the light-shielding film using a fluorine-based gas to thereby carry out pattern transfer, and carrying out dry etching using a chlorine-based gas containing oxygen after the pattern transfer to the light-shielding film, thereby removing the etching mask film (Structure 13).

As a consequence, the same effects as those described with respect to the above-mentioned Structures 1 to 10 can be obtained.

A semiconductor device manufacturing method of this invention is carried out by transferring a pattern of the above-mentioned photomask according to this invention (Structure 14).

In this invention, photomask blanks include a binary photomask blank which does not use the phase shift effect, and a resist-coated mask blank. Further, the photomask blanks include a halftone phase shift mask blank having a phase shift film between a transparent substrate and a light-shielding film. The phase shift film can have the same structure as conventional and is formed of, for example, a material comprising MoSiN, MoSiON, or the like. Further, an etching stopper film having etching resistance to the light-shielding film or the phase shift film may be provided between the transparent substrate and the light-shielding film or between the phase shift film and the light-shielding film. The etching stopper film is preferably in the form of a Cr-based material film like an etching mask film because, upon etching the etching stopper film, the etching mask film can be simultaneously stripped.

In this invention, photomasks include a binary photomask which does not use the phase shift effect and, among phase shift masks which use the phase shift effect, a halftone phase shift mask, a Levenson phase shift mask, and an enhancer mask are included. The photomasks include a reticle.

In this invention, photomasks adapted to be applied with exposure light having a wavelength of 200 nm or less include a photomask for ArF excimer laser exposure.

Hereinbelow, Examples of this invention and Comparative Examples will be shown. In each of the Examples and Comparative Examples, films such as a light-shielding film and an etching mask film were formed by a sputtering method as a film forming method using a DC magnetron sputtering apparatus as a sputtering apparatus. However, for carrying out this invention, there is no particular limitation to such a film forming method and film forming apparatus and use may be made of another type of sputtering apparatus such as an RF magnetron sputtering apparatus.

EXAMPLE (1-1)

Manufacture of Photomask Blank

Using a synthetic quartz substrate having a 6-inch square size with a thickness of 0.25 inches as a transparent substrate 1, a MoSiON film 11 (back-surface antireflection layer), a MoSi (light-shielding layer) 12, and a MoSiON film (front-surface antireflection layer) 13 were respectively formed as a light-shielding film 10 on the transparent substrate 1 (FIG. 1).

Specifically, using a target of Mo:Si=21:79 (at % ratio) and using Ar, $O_2$, $N_2$, and He (gas flow rate ratio Ar:$O_2$:$N_2$:He=5:4:49:42) at a sputtering gas pressure of 0.2 Pa, a film comprising molybdenum, silicon, oxygen, and nitrogen (Mo: 0.3 at %, Si: 24.6 at %, O: 22.5 at %, N: 52.6 at %) was formed to a thickness of 7 nm by setting the power of the DC power supply to 3.0 kW.

Then, using a target of Mo:Si=21:79 (at % ratio) and using Ar at a sputtering gas pressure of 0.1 Pa, a film comprising molybdenum and silicon (Mo: 21.0 at %, Si: 79 at %) was formed to a thickness of 30 nm by setting the power of the DC power supply to 2.0 kW.

Then, using a target of Mo:Si=4:96 (at % ratio) and using Ar, $O_2$, $N_2$, and He (gas flow rate ratio Ar:$O_2$:$N_2$:He=6:5:11:16) at a sputtering gas pressure of 0.1 Pa, a film comprising molybdenum, silicon, oxygen, and nitrogen (Mo: 1.6 at %, Si: 38.8 at %, O: 18.8 at %, N: 40.8 at %) was formed to a thickness of 15 nm by setting the power of the DC power supply to 3.0 kW. The total thickness of the light-shielding film 10 was set to 52 nm. The optical density (OD) of the light-shielding film 10 was 3 at the wavelength 193 nm of ArF excimer laser exposure light.

Then, the above-mentioned substrate was heat-treated (annealed) at 450° C. for 30 minutes.

Then, an etching mask film 20 was formed on the light-shielding film 10 (FIG. 1). Specifically, using a chromium target and using Ar, $CO_2$, $N_2$, and He (gas flow rate ratio Ar:$CO_2$:$N_2$:He=21:37:11:31) at a sputtering gas pressure of 0.2 Pa, the film formation was carried out by setting the power and voltage of the DC power supply to 1.8 kW and 334V, respectively, under the conditions near (just before) the start of transition from the metallic mode to the reactive mode (around a $CO_2$ flow rate of 37 sccm) (see FIG. 3(2)), thereby forming a CrOCN film (Cr: 33 at %, O: 38.9 at %, C: 11.1 at %, N: 17 at %) to a thickness of 5 nm. In this event, the CrOCN film was annealed at a temperature lower than the annealing temperature of the MoSi light-shielding film, thereby adjusting the stress of the CrOCN film to be as small as possible (preferably, substantially zero) without affecting the film stress of the MoSi light-shielding film.

In this manner, a photomask blank formed with the light-shielding film for ArF excimer laser exposure was obtained.

The elements of the thin films were analyzed by the Rutherford backscattering spectrometry. The same shall apply to the following Examples and Comparative Examples.

(Manufacture of Photomask)

On the etching mask film 20 of the photomask blank, a chemically amplified positive resist 50 for electron beam writing (exposure) (PRL009: manufactured by FUJIFILM Electronic Materials Co., Ltd.) was coated to a thickness of 100 nm by a spin-coating method (FIG. 1, FIG. 2(1)).

Then, using an electron beam writing apparatus, a desired pattern (40 nm, 45 nm, 50 nm, 55 nm, 60 nm line and space) was written on the resist film 50 and, thereafter, development was carried out using a predetermined developer, thereby forming a resist pattern 50*a* (FIG. 2(2)).

Then, using the resist pattern 50*a* as a mask, the etching mask film 20 was dry-etched (FIG. 2(3)). A mixed gas of $Cl_2$ and $O_2$ ($Cl_2$:$O_2$=4:1) was used as a dry etching gas.

Then, the remaining resist pattern 50*a* was stripped and removed by a chemical solution.

Then, using an etching mask film pattern 20*a* as a mask, the light-shielding film 10 was dry-etched using a mixed gas of $SF_6$ and He, thereby forming a light-shielding film pattern 10*a* (FIG. 2(4)).

Then, the etching mask film pattern 20*a* was stripped by dry etching with a mixed gas of $Cl_2$ and $O_2$ (FIG. 2(5)) and then predetermined cleaning was carried out, thereby obtaining a photomask 100.

In this photomask manufacturing example, the resist pattern 50*a* was stripped and removed after forming the etching mask film pattern 20*a*. This is because, when forming the light-shielding film pattern 10*a* in the light-shielding film 10 in the next process, if the side wall height of the mask pattern (=side wall height of the etching mask film pattern 20*a*) is lower, the CD accuracy can be made higher while the microloading can be made smaller, thus resulting in better processing accuracy. In the case of manufacturing a photomask that does not require the processing accuracy to that degree or in the case where the etching mask film should also have the function of antireflection for exposure light, the resist pattern 50*a* may be stripped and removed after forming the light-shielding film pattern 10*a*.

FIG. 4 shows the structure of the photomask blank (properties such as materials and thicknesses of the light-shielding film, the etching mask film, and the resist film) used in Example (1-1). Further, FIG. 4 shows the processing properties of the photomask blank (the thickness of the resist film after dry etching of the etching mask film, the thickness of the etching mask film after dry etching of the light-shielding film, the CD linearity, the CD uniformity, the resolution of the resist film (LER (Line Edge Roughness) with less than 40 nm, resist collapse, etc.), LER (Line Edge Roughness) of the etching mask film) used in Example (1-1) and the resolution of the light-shielding film pattern in the obtained photomask.

EXAMPLE (1-2)

Example (1-2) was the same as Example (1-1) except that, in Example (1-1), the thickness of the CrOCN film being the etching mask film 20 was changed from 5 nm to 10 nm.

FIG. 4 shows the structure of a photomask blank used in Example (1-2), the processing properties thereof, and the resolution of a light-shielding film pattern in an obtained photomask.

EXAMPLE (1-3)

Example (1-3) was the same as Example (1-1) except that, in Example (1-1), the thickness of the CrOCN film being the etching mask film 20 was changed from 5 nm to 15 nm.

FIG. 4 shows the structure of a photomask blank used in Example (1-3), the processing properties thereof, and the resolution of a light-shielding film pattern in an obtained photomask.

EXAMPLE (1-4)

Example (1-4) was the same as Example (1-1) except that, in Example (1-1), the thickness of the CrOCN film being the etching mask film 20 was changed from 5 nm to 20 nm.

FIG. 4 shows the structure of a photomask blank used in Example (1-4), the processing properties thereof, and the resolution of a light-shielding film pattern in an obtained photomask.

EXAMPLES (1-5) TO (1-8)

Examples (1-5) to (1-8) were the same as Examples (1-1) to (1-4) except that, in each of Examples (1-1) to (1-4), the CrOCN film being the etching mask film 20 was changed to a CrOC film and the film formation was carried out under the following conditions to set the Cr content of the CrOC film to 35 at %.

Specifically, the CrOC films being the etching mask films 20 were respectively formed such that, using a chromium target and using Ar, $CO_2$, and He (gas flow rate ratio Ar:$CO_2$:He=18:40:32) at a sputtering gas pressure of 0.2 Pa, the film formation was carried out by setting the power and voltage of the DC power supply to 1.8 kW and 343V, respectively, under the conditions near (just before) the start of transition from the metallic mode to the reactive mode (around a $CO_2$ flow rate of 40 sccm) (see FIG. 3(1)), thereby forming CrOC films (Cr content in the film: 35 at %) to thicknesses of 5 nm, 10 nm, 15 nm, and 20 nm, respectively.

FIG. 4 shows the structures of photomask blanks used in Examples (1-5) to (1-8), the processing properties thereof, and the resolutions of light-shielding film patterns in obtained photomasks.

EXAMPLES (1-9) TO (1-12)

Examples (1-9) to (1-12) were the same as Examples (1-1) to (1-4) except that, in each of Examples (1-1) to (1-4), the CrOCN film being the etching mask film 20 was changed to a CrON film and the film formation was carried out under the following conditions.

Specifically, the CrON films being the etching mask films 20 were respectively formed such that, using a chromium target and using Ar, and NO, and He (gas flow rate ratio Ar:NO:He=18:80:32) at a sputtering gas pressure of 0.2 Pa, the film formation was carried out by setting the power and voltage of the DC power supply to 1.8 kW and 295V, respectively, in the reactive mode (see FIG. 3(3)), thereby forming CrON films (Cr content in the film:35 at %) to thicknesses of 5 nm, 10 nm, 15 nm, and 20 nm, respectively.

FIG. 5 shows the structures of photomask blanks used in Examples (1-9) to (1-12), the processing properties thereof, and the resolutions of light-shielding film patterns in obtained photomasks.

REFERENCE EXAMPLES (1-13) TO (1-16)

Reference Examples (1-13) to (1-16) were the same as Examples (1-1) to (1-4) except that, in each of Examples (1-1) to (1-4), the CrOCN film being the etching mask film 20 was changed to a CrN film and the film formation was carried out under the following conditions.

Specifically, the CrN films being the etching mask films 20 were respectively formed such that, using a chromium target and using Ar and $N_2$ (gas flow rate ratio Ar:$N_2$=10:60) at a sputtering gas pressure of 0.2 Pa, the film formation was carried out by setting the power and voltage of the DC power supply to 2.0 kW and 350V, respectively, in the reactive mode, thereby forming CrN films (Cr content in the film: 50 at %) to thicknesses of 5 nm, 10 nm, 15 nm, and 20 nm, respectively.

FIG. 5 shows the structures of photomask blanks used in Reference Examples (1-13) to (1-16), the processing properties thereof, and the resolutions of light-shielding film patterns in obtained photomasks.

EXAMPLE (1-17)

Example (1-17) was the same as Example (1-1) except that, in Example (1-1), the film formation was carried out under the following conditions with respect to the MoSi (light-shielding layer) 12 in the light-shielding film 10 to change the thickness of the MoSi (light-shielding layer) 12, to change the Si content of the MoSi (light-shielding layer) 12, and to change the total thickness of the light-shielding film 10.

The MoSi (light-shielding layer) 12 in the light-shielding film 10 was formed such that, using a target of Mo:Si=9:91 (at % ratio) and using Ar at a sputtering gas pressure of 0.1 Pa, a film comprising molybdenum and silicon (Mo: 9 at %, Si: 91 at %) was formed to a thickness of 34 nm by setting the power of the DC power supply to 2.0 kW so that the total thickness of the light-shielding film 10 was set to 56 nm.

FIG. 6 shows the structure of a photomask blank used in Example (1-17), the processing properties thereof, and the resolution of a light-shielding film pattern in an obtained photomask.

EXAMPLE (1-18)

Example (1-18) was the same as Example (1-1) except that, in Example (1-1), the film formation was carried out under the following conditions with respect to the MoSi (light-shielding layer) 12 in the light-shielding film 10 to change the thickness of the MoSi (light-shielding layer) 12, to change the Si content of the MoSi (light-shielding layer) 12, and to change the total thickness of the light-shielding film 10.

The MoSi (light-shielding layer) 12 in the light-shielding film 10 was formed such that, using a target of Mo:Si=15:85 (at % ratio) and using Ar at a sputtering gas pressure of 0.1 Pa, a film comprising molybdenum and silicon (Mo: 15 at %, Si: 85 at %) was formed to a thickness of 31 nm by setting the power of the DC power supply to 2.0 kW so that the total thickness of the light-shielding film 10 was set to 53 nm.

FIG. 6 shows the structure of a photomask blank used in Example (1-18), the processing properties thereof, and the resolution of a light-shielding film pattern in an obtained photomask.

EXAMPLE (1-19)

Example (1-19) was the same as Example (1-1) except that, in Example (1-1), the film formation was carried out under the following conditions with respect to the MoSi (light-shielding layer) 12 in the light-shielding film 10 to change the thickness of the MoSi (light-shielding layer) 12, to change the Si content of the MoSi (light-shielding layer) 12, and to change the total thickness of the light-shielding film 10.

The MoSi (light-shielding layer) 12 in the light-shielding film 10 was formed such that, using a target of Mo:Si=1:2 (at % ratio) and using Ar at a sputtering gas pressure of 0.1 Pa, a film comprising molybdenum and silicon (Mo: 33 at %, Si: 67 at %) was formed to a thickness of 29 nm by setting the power of the DC power supply to 2.0 kW so that the total thickness of the light-shielding film 10 was set to 51 nm.

FIG. 6 shows the structure of a photomask blank used in Example (1-19), the processing properties thereof, and the resolution of a light-shielding film pattern in an obtained photomask.

EXAMPLE (1-20)

Example (1-20) was the same as Example (1-1) except that, in Example (1-1), the film formation was carried out under the following conditions with respect to the MoSi (light-shielding layer) 12 in the light-shielding film 10 to change the thickness of the MoSi (light-shielding layer) 12, to change the Si content of the MoSi (light-shielding layer) 12, and to change the total thickness of the light-shielding film 10.

The MoSi (light-shielding layer) 12 in the light-shielding film 10 was formed such that, using a target of Mo:Si=40:60 (at % ratio) and using Ar at a sputtering gas pressure of 0.1 Pa, a film comprising molybdenum and silicon (Mo: 40 at %, Si: 60 at %) was formed to a thickness of 30 nm by setting the power of the DC power supply to 2.0 kW so that the total thickness of the light-shielding film 10 was set to 52 nm.

FIG. 6 shows the structure of a photomask blank used in Example (1-20), the processing properties thereof, and the resolution of a light-shielding film pattern in an obtained photomask.

EXAMPLE (1-21)

Example (1-21) was the same as Example (1-1) except that, in Example (1-1), the MoSiON film 11 (back-surface antireflection layer) in the light-shielding film 10 was not formed and the film formation was carried out under the following conditions with respect to the MoSi (light-shielding layer) 12 and the MoSiON film (front-surface antireflection layer) 13 in the light-shielding film 10 to change the MoSi (light-shielding layer) 12 to a MoSiN (light-shielding layer) 12, to change the thickness and Si content thereof, to change the thickness of the MoSiON film (front-surface antireflection layer) 13, and to change the total thickness of the light-shielding film 10.

As the MoSiN (light-shielding layer) 12 in the light-shielding film 10, a film comprising molybdenum, silicon, and nitrogen (Mo: 9 at %, Si: 72.8 at %, N: 18.2 at %) was formed to a thickness of 52 nm.

As the MoSiON film (front-surface antireflection layer) 13 in the light-shielding film 10, a film comprising molybdenum, silicon, oxygen, and nitrogen (Mo: 1.6 at %, Si: 38.8 at %, O: 18.8 at %, N: 40.8 at %) was formed to a thickness of 8 nm.

The total thickness of the light-shielding film 10 was set to 60 nm. The optical density (OD) of the light-shielding film 10 was 3 at the wavelength 193 nm of ArF excimer laser exposure light.

FIG. 6 shows the structure of a photomask blank used in Example (1-21), the processing properties thereof, and the resolution of a light-shielding film pattern in an obtained photomask.

EXAMPLE (1-22)

Example (1-22) was the same as Example (1-1) except that, in Example (1-1), the MoSiON film 11 (back-surface antireflection layer) in the light-shielding film 10 was not formed and the film formation was carried out under the following conditions with respect to the MoSi (light-shielding layer) 12 and the MoSiON film (front-surface antireflection layer) 13 in the light-shielding film 10 to change the MoSi (light-shielding layer) 12 to a MoSiN (light-shielding layer) 12, to change the thickness and Si content thereof, to change the thickness of the MoSiON film (front-surface antireflection layer) 13, and to change the total thickness of the light-shielding film 10.

As the MoSiN (light-shielding layer) 12 in the light-shielding film 10, a film comprising molybdenum, silicon, and nitrogen (Mo: 18 at %, Si: 63.8 at %, N: 18.2 at %) was formed to a thickness of 50 nm.

As the MoSiON film (front-surface antireflection layer) 13 in the light-shielding film 10, a film comprising molybdenum, silicon, oxygen, and nitrogen (Mo: 1.6 at %, Si: 38.8 at %, O: 18.8 at %, N: 40.8 at %) was formed to a thickness of 10 nm.

The total thickness of the light-shielding film 10 was set to 60 nm. The optical density (OD) of the light-shielding film 10 was 3 at the wavelength 193 nm of ArF excimer laser exposure light.

FIG. 6 shows the structure of a photomask blank used in Example (1-22), the processing properties thereof, and the resolution of a light-shielding film pattern in an obtained photomask.

EXAMPLE (1-23)

Example (1-23) was the same as Example (1-1) except that, in Example (1-1), the MoSiON film 11 (back-surface antireflection layer) in the light-shielding film 10 was not formed and the film formation was carried out under the following conditions with respect to the MoSi (light-shielding layer) 12 and the MoSiON film (front-surface antireflection layer) 13 in the light-shielding film 10 to change the MoSi (light-shielding layer) 12 to a MoSiN (light-shielding layer) 12, to change the thickness and Si content thereof, to change the thickness of the MoSiON film (front-surface antireflection layer) 13, and to change the total thickness of the light-shielding film 10.

As the MoSiN (light-shielding layer) 12 in the light-shielding film 10, a film comprising molybdenum, silicon, and nitrogen (Mo: 30 at %, Si: 51.8 at %, N: 18.2 at %) was formed to a thickness of 45 nm.

As the MoSiON film (front-surface antireflection layer) 13 in the light-shielding film 10, a film comprising molybdenum, silicon, oxygen, and nitrogen (Mo: 1.6 at %, Si: 38.8 at %, O: 18.8 at %, N: 40.8 at %) was formed to a thickness of 15 nm.

The total thickness of the light-shielding film 10 was set to 60 nm. The optical density (OD) of the light-shielding film 10 was 3 at the wavelength 193 nm of ArF excimer laser exposure light.

FIG. 6 shows the structure of a photomask blank used in Example (1-23), the processing properties thereof, and the resolution of a light-shielding film pattern in an obtained photomask.

EXAMPLE (1-24)

Example (1-24) was the same as Example (1-1) except that, in Example (1-1), the MoSiON film 11 (back-surface antireflection layer) in the light-shielding film 10 was not formed and the film formation was carried out under the following conditions with respect to the MoSi (light-shielding layer) 12 and the MoSiON film (front-surface antireflection layer) 13 in the light-shielding film 10 to change the MoSi (light-shielding layer) 12 to a MoSiN (light-shielding layer) 12, to change the thickness and Si content thereof, to change the thickness of the MoSiON film (front-surface antireflection layer) 13, and to change the total thickness of the light-shielding film 10.

As the MoSiN (light-shielding layer) 12 in the light-shielding film 10, a film comprising molybdenum, silicon, and nitrogen (Mo: 40 at %, Si: 41.8 at %, N: 18.2 at %) was formed to a thickness of 42 nm.

As the MoSiON film (front-surface antireflection layer) 13 in the light-shielding film 10, a film comprising molybdenum, silicon, oxygen, and nitrogen (Mo: 1.6 at %, Si: 38.8 at %, O: 18.8 at %, N: 40.8 at %) was formed to a thickness of 18 nm.

The total thickness of the light-shielding film 10 was set to 60 nm. The optical density (OD) of the light-shielding film 10 was 3 at the wavelength 193 nm of ArF excimer laser exposure light.

FIG. 6 shows the structure of a photomask blank used in Example (1-24), the processing properties thereof, and the resolution of a light-shielding film pattern in an obtained photomask.

EXAMPLE (1-25)

Example (1-25) was the same as Example (1-1) except that, in Example (1-1), the MoSiON film 11 (back-surface antireflection layer) in the light-shielding film 10 was not formed and the film formation was carried out under the following conditions with respect to the MoSi (light-shielding layer) 12 and the MoSiON film (front-surface antireflection layer) 13 in the light-shielding film 10 to change the MoSi (light-shielding layer) 12 to a MoSiN (light-shielding layer) 12, to change the thickness and Si content thereof, to change the thickness of the MoSiON film (front-surface antireflection layer) 13, and to change the total thickness of the light-shielding film 10.

As the MoSiN (light-shielding layer) 12 in the light-shielding film 10, a film comprising molybdenum, silicon, and nitrogen (Mo: 14.7 at %, Si: 56.2 at %, N: 29.1 at %) was formed to a thickness of 50 nm.

As the MoSiON film (front-surface antireflection layer) 13 in the light-shielding film 10, a film comprising molybdenum, silicon, oxygen, and nitrogen (Mo: 2.6 at %, Si: 57.1 at %, O: 15.9 at %, N: 24.4 at %) was formed to a thickness of 10 nm.

The total thickness of the light-shielding film 10 was set to 60 nm. The optical density (OD) of the light-shielding film 10 was 3 at the wavelength 193 nm of ArF excimer laser exposure light.

FIG. 6 shows the structure of a photomask blank used in Example (1-25), the processing properties thereof, and the resolution of a light-shielding film pattern in an obtained photomask.

EXAMPLES (2-1) TO (2-12) AND REFERENCE EXAMPLES (2-13) TO (2-16)

Examples (2-1) to (2-12) and Reference Examples (2-13) to (2-16) were the same as Examples (1-1) to (1-12) and Reference Examples (1-13) to (1-16) except that, in each of Examples (1-1) to (1-12) and Reference Examples (1-13) to (1-16), the chemically amplified positive resist 50 for electron beam writing (exposure) (PRL009: manufactured by FUJIFILM Electronic Materials Co., Ltd.) was changed to a chemically amplified positive resist 50 for electron beam writing (exposure) (SVL-08: manufactured by FUJIFILM Electronic Materials Co., Ltd.).

FIGS. 7 and 8 show the structures of photomask blanks used in Examples (2-1) to (2-12) and Reference Examples (2-13) to (2-16), the processing properties thereof, and the resolutions of light-shielding film patterns in obtained photomasks.

EXAMPLE (2-17)

Example (2-17) was the same as Example (2-4) except that, in Example (2-4), the CrOCN film being the etching mask film 20 was formed under the following conditions so that the Cr content of the CrOCN film was set to 40 at %.

Specifically, the CrOCN film being the etching mask film 20 was formed such that, using a chromium target and using Ar, $CO_2$, $N_2$, and He (gas flow rate ratio Ar:$CO_2$:$N_2$:He=22:33:11:33) at a sputtering gas pressure of 0.2 Pa, the film formation was carried out by setting the power of the DC power supply to 1.8 kW, thereby forming a CrOCN film (Cr content in the film: 40 at %) to a thickness of 20 nm.

FIG. 9 shows the structure of a photomask blank used in Example (2-17), the processing properties thereof, and the resolution of a light-shielding film pattern in an obtained photomask.

EXAMPLE (2-18)

Example (2-18) was the same as Example (2-4) except that, in Example (2-4), the CrOCN film being the etching mask film 20 was formed under the following conditions so that the Cr content of the CrOCN film was set to 45 at %.

Specifically, the CrOCN film being the etching mask film 20 was formed such that, using a chromium target and using Ar, $CO_2$, $N_2$, and He (gas flow rate ratio Ar:$CO_2$:$N_2$:He=23:29:12:35) at a sputtering gas pressure of 0.2 Pa, the film formation was carried out by setting the power of the DC power supply to 1.8 kW, thereby forming a CrOCN film (Cr content in the film: 45 at %) to a thickness of 20 nm.

FIG. 9 shows the structure of a photomask blank used in Example (2-18), the processing properties thereof, and the resolution of a light-shielding film pattern in an obtained photomask.

EXAMPLE (2-19)

Example (2-19) was the same as Example (2-8) except that, in Example (2-8), the CrOC film being the etching mask film 20 was formed under the following conditions so that the Cr content of the CrOC film was set to 40 at %.

Specifically, the CrOC film being the etching mask film 20 was formed such that, using a chromium target and using Ar, $CO_2$, and He (gas flow rate ratio Ar:$CO_2$:He=15:31:23) at a sputtering gas pressure of 0.2 Pa, the film formation was carried out by setting the power of the DC power supply to 1.8 kW, thereby forming a CrOC film (Cr content in the film: 40 at %) to a thickness of 20 nm.

FIG. 9 shows the structure of a photomask blank used in Example (2-19), the processing properties thereof, and the resolution of a light-shielding film pattern in an obtained photomask.

EXAMPLE (2-20)

Example (2-20) was the same as Example (2-8) except that, in Example (2-8), the CrOC film being the etching mask film 20 was formed under the following conditions so that the Cr content of the CrOC film was set to 45 at %.

Specifically, the CrOC film being the etching mask film 20 was formed such that, using a chromium target and using Ar, $CO_2$, and He (gas flow rate ratio Ar:$CO_2$:He=17:29:25) at a sputtering gas pressure of 0.2 Pa, the film formation was carried out by setting the power of the DC power supply to 1.8 kW, thereby forming a CrOC film (Cr content in the film: 45 at %) to a thickness of 20 nm.

FIG. 9 shows the structure of a photomask blank used in Example (2-20), the processing properties thereof, and the resolution of a light-shielding film pattern in an obtained photomask.

EXAMPLE (2-21)

Example (2-21) was the same as Example (2-12) except that, in Example (2-12), the CrON film being the etching mask film 20 was formed under the following conditions so that the Cr content of the CrON film was set to 40 at %.

Specifically, the CrON film being the etching mask film 20 was formed such that, using a chromium target and using Ar, NO, and He (gas flow rate ratio Ar:NO:He=15:62:23) at a sputtering gas pressure of 0.2 Pa, the film formation was carried out by setting the power of the DC power supply to 1.8 kW, thereby forming a CrON film (Cr content in the film: 40 at %) to a thickness of 20 nm.

FIG. 9 shows the structure of a photomask blank used in Example (2-21), the processing properties thereof, and the resolution of a light-shielding film pattern in an obtained photomask.

EXAMPLE (2-22)

Example (2-22) was the same as Example (2-12) except that, in Example (2-12), the CrON film being the etching mask film 20 was formed under the following conditions so that the Cr content of the CrON film was set to 45 at %.

Specifically, the CrON film being the etching mask film 20 was formed such that, using a chromium target and using Ar, NO, and He (gas flow rate ratio Ar:NO:He=17:58:25) at a sputtering gas pressure of 0.2 Pa, the film formation was carried out by setting the power of the DC power supply to 1.8 kW, thereby forming a CrON film (Cr content in the film: 45 at %) to a thickness of 20 nm.

FIG. 9 shows the structure of a photomask blank used in Example (2-22), the processing properties thereof, and the resolution of a light-shielding film pattern in an obtained photomask.

EXAMPLE (2-23)

Example (2-23) was the same as Reference Example (2-16) except that, in Reference Example (2-16), the CrN film being the etching mask film 20 was formed under the following conditions so that the Cr content of the CrN film was set to 40 at %.

Specifically, the CrN film being the etching mask film 20 was formed such that, using a chromium target and using Ar and $N_2$ (gas flow rate ratio Ar:$N_2$=10:80) at a sputtering gas pressure of 0.2 Pa, the film formation was carried out by setting the power of the DC power supply to 2.0 kW, thereby forming a CrN film (Cr content in the film: 40 at %) to a thickness of 20 nm.

FIG. 9 shows the structure of a photomask blank used in Example (2-23), the processing properties thereof, and the resolution of a light-shielding film pattern in an obtained photomask.

EXAMPLE (2-24)

Example (2-24) was the same as Reference Example (2-16) except that, in Reference Example (2-16), the CrN film being the etching mask film 20 was formed under the following conditions so that the Cr content of the CrN film was set to 45 at %.

Specifically, the CrN film being the etching mask film 20 was formed such that, using a chromium target and using Ar and $N_2$ (gas flow rate ratio Ar:$N_2$=10:70) at a sputtering gas pressure of 0.2 Pa, the film formation was carried out by setting the power of the DC power supply to 2.0 kW, thereby forming a CrN film (Cr content in the film: 45 at %) to a thickness of 20 nm.

FIG. 9 shows the structure of a photomask blank used in Example (2-24), the processing properties thereof, and the resolution of a light-shielding film pattern in an obtained photomask.

EXAMPLES (3-1) TO (3-12) AND REFERENCE EXAMPLES (3-13) TO (3-16)

Examples (3-1) to (3-12) and Reference Examples (3-13) to (3-16) were the same as Examples (1-1) to (1-12) and Reference Examples (1-13) to (1-16) except that, in each of Examples (1-1) to (1-12) and Reference Examples (1-13) to (1-16), the thickness of the chemically amplified positive resist 50 for electron beam writing (exposure) (PRL009: manufactured by FUJIFILM Electronic Materials Co., Ltd.) was changed from 100 nm to 90 nm and, following it, the ratio (aspect ratio) of the line width (40 nm) of a resist pattern to the thickness 90 nm of the resist film was changed to 1:2.25.

FIGS. 10 and 11 show the structures of photomask blanks used in Examples (3-1) to (3-12) and Reference Examples (3-13) to (3-16), the processing properties thereof, and the resolutions of light-shielding film patterns in obtained photomasks.

EXAMPLES (3-17) TO (3-24)

Examples (3-17) to (3-24) were the same as Examples (2-17) to (2-24) except that, in each of Examples (2-17) to (2-24), the chemically amplified positive resist 50 for electron beam writing (exposure) (SVL-08: manufactured by FUJIFILM Electronic Materials Co., Ltd.) was changed to a chemically amplified positive resist 50 for electron beam writing (exposure) (PRL009: manufactured by FUJIFILM Electronic Materials Co., Ltd.), the thickness of the chemically amplified positive resist 50 for electron beam writing (exposure) was set to 90 nm, and, following it, the ratio (aspect ratio) of the line width (40 nm) of a resist pattern to the thickness 90 nm of the resist film was changed to 1:2.25.

FIG. 12 shows the structures of photomask blanks used in Examples (3-17) to (3-24), the processing properties thereof, and the resolutions of light-shielding film patterns in obtained photomasks.

EXAMPLES (4-1) TO (4-9) AND REFERENCE EXAMPLES (4-10) TO (4-12)

Examples (4-1) to (4-9) and Reference Examples (4-10) to (4-12) were the same as Examples (1-1) to (1-3), Examples (1-5) to (1-7), Examples (1-9) to (1-11), and Reference Examples (1-13) to (1-15) except that, in each of Examples (1-1) to (1-3), Examples (1-5) to (1-7), Examples (1-9) to (1-11), and Reference Examples (1-13) to (1-15), the thickness of the chemically amplified positive resist 50 for electron beam writing (exposure) (PRL009: manufactured by FUJIFILM Electronic Materials Co., Ltd.) was changed from 100 nm to 75 nm and, following it, the ratio (aspect ratio) of the line width (40 nm) of a resist pattern to the thickness 75 nm of the resist film was changed to 1:1.9.

FIGS. 13 and 14 show the structures of photomask blanks used in Examples (4-1) to (4-9) and Reference Examples (4-10) to (4-12), the processing properties thereof, and the resolutions of light-shielding film patterns in obtained photomasks.

EXAMPLES (4-13) TO (4-20)

Examples (4-13) to (4-20) were the same as Examples (2-17) to (2-24) except that, in each of Examples (2-17) to (2-24), the chemically amplified positive resist 50 for electron beam writing (exposure) (SVL-08: manufactured by FUJIFILM Electronic Materials Co., Ltd.) was changed to a chemically amplified positive resist 50 for electron beam writing (exposure) (PRL009: manufactured by FUJIFILM Electronic Materials Co., Ltd.), the thickness of the chemically amplified positive resist 50 for electron beam writing (exposure) was set to 75 nm and, following it, the ratio (aspect ratio) of the line width (40 nm) of a resist pattern to the thickness 75 nm of the resist film was changed to 1:1.9, and the thickness of the etching mask film was set to 15 nm.

FIG. 14 shows the structures of photomask blanks used in Examples (4-13) to (4-20), the processing properties thereof, and the resolutions of light-shielding film patterns in obtained photomasks.

EXAMPLES (5-1) TO (5-6) AND REFERENCE EXAMPLES (5-7) AND (5-8)

Examples (5-1) to (5-6) and Reference Examples (5-7) and (5-8) were the same as Examples (1-1) and (1-2), Examples (1-5) and (1-6), Examples (1-9) and (1-10), and Reference Examples (1-13) and (1-14) except that, in each of Examples (1-1) and (1-2), Examples (1-5) and (1-6), Examples (1-9) and (1-10), and Reference Examples (1-13) and (1-14), the thickness of the chemically amplified positive resist 50 for electron beam writing (exposure) (PRL009: manufactured by FUJIFILM Electronic Materials Co., Ltd.) was changed from 100 nm to 65 nm and, following it, the ratio (aspect ratio) of the line width (40 nm) of a resist pattern to the thickness 65 nm of the resist film was changed to 1:1.6.

FIG. 15 shows the structures of photomask blanks used in Examples (5-1) to (5-6) and Reference Examples (5-7) and (5-8), the processing properties thereof, and the resolutions of light-shielding film patterns in obtained photomasks.

EXAMPLES (5-9) TO (5-16)

Examples (5-9) to (5-16) were the same as Examples (2-17) to (2-24) except that, in each of Examples (2-17) to (2-24), the chemically amplified positive resist 50 for electron beam writing (exposure) (SVL-08: manufactured by FUJIFILM Electronic Materials Co., Ltd.) was changed to a chemically amplified positive resist 50 for electron beam writing (exposure) (PRL009: manufactured by FUJIFILM Electronic Materials Co., Ltd.), the thickness of the chemically amplified positive resist 50 for electron beam writing (exposure) was set to 65 nm and, following it, the ratio (aspect ratio) of the line width (40 nm) of a resist pattern to the thickness 65 nm of the resist film was changed to 1:1.6, and the thickness of the etching mask film was set to 10 nm.

FIG. 16 shows the structures of photomask blanks used in Examples (5-9) to (5-16), the processing properties thereof, and the resolutions of light-shielding film patterns in obtained photomasks.

COMPARATIVE EXAMPLES 1 AND 2

Comparative Example 1 was the same as Example (2-1) except that, in Example (2-1), the thickness of the CrOCN film being the etching mask film 20 was changed from 5 nm to 4 nm.

Comparative Example 2 was the same as Example (2-4) except that, in Example (2-4), the thickness of the CrOCN film being the etching mask film 20 was changed from 20 nm to 30 nm.

FIG. 17 shows the structures of photomask blanks used in Comparative Examples 1 and 2, the processing properties thereof, and the resolutions of light-shielding film patterns in obtained photomasks.

COMPARATIVE EXAMPLES 3 AND 4

Comparative Example 3 was the same as Example (1-4) except that, in Example (1-4), the thickness of the chemically amplified positive resist 50 for electron beam writing (exposure) (PRL009: manufactured by FUJIFILM Electronic Materials Co., Ltd.) was changed from 100 nm to 120 nm and, following it, the ratio (aspect ratio) of the line width (40 nm) of a resist pattern to the thickness 120 nm of the resist film was changed to 1:3.

Comparative Example 4 was the same as Example (2-4) except that, in Example (2-4), the thickness of the chemically amplified positive resist 50 for electron beam writing (exposure) (SVL-08: manufactured by FUJIFILM Electronic Materials Co., Ltd.) was changed from 100 nm to 120 nm and, following it, the ratio (aspect ratio) of the line width (40 nm) of a resist pattern to the thickness 120 nm of the resist film was changed to 1:3.

FIG. 17 shows the structures of photomask blanks used in Comparative Examples 3 and 4, the processing properties thereof, and the resolutions of light-shielding film patterns in obtained photomasks.

COMPARATIVE EXAMPLES 5 TO 7

Comparative Examples 5 to 7 were the same as Reference Examples (2-14) to (2-16) except that, in each of Reference Examples (2-14) to (2-16), the CrN film being the etching mask film 20 was formed under the following conditions so that the Cr content of the CrN film was changed from 50 at % to 90 at %.

Specifically, the CrN films being the etching mask films 20 were respectively formed such that, using a chromium target and using Ar, $N_2$, and He (gas flow rate ratio $Ar:N_2:He=18:18:32$) at a sputtering gas pressure of 0.2 Pa, the film formation was carried out by setting the power and voltage of the DC power supply to 1.8 kW and 335V, respectively, in the metallic mode, thereby forming CrN films (Cr content in the film:90 at %) to thicknesses of 10 nm, 15 nm, and 20 nm, respectively.

FIG. 17 shows the structures of photomask blanks used in Comparative Examples 5 to 7, the processing properties thereof, and the resolutions of light-shielding film patterns in obtained photomasks.

COMPARATIVE EXAMPLE 8

Comparative Example 8 was the same as Reference Example (1-16) except that, in Reference Example (1-16), the CrN film being the etching mask film 20 was formed under the following conditions so that the Cr content of the CrN film was changed from 50 at % to 90 at %.

Specifically, the CrN film being the etching mask film 20 was formed such that, using a chromium target and using Ar, $N_2$ and He (gas flow rate ratio $Ar:N_2:He=18:18:32$) at a sputtering gas pressure of 0.2 Pa, the film formation was carried out by setting the power and voltage of the DC power supply to 1.8 kW and 335V, respectively, in the metallic mode, thereby forming a CrN film (Cr content in the film:90 at %) to a thickness of 20 nm.

FIG. 17 shows the structure of a photomask blank used in Comparative Example 8, the processing properties thereof, and the resolution of a light-shielding film pattern in an obtained photomask.

COMPARATIVE EXAMPLE 9

Comparative Example 9 was the same as Reference Example (2-16) except that, in Reference Example (2-16), the CrN film being the etching mask film 20 was formed under the following conditions so that the Cr content of the CrN film was changed from 50 at % to 60 at %.

Specifically, the CrN film being the etching mask film 20 was formed such that, using a chromium target and using Ar, $N_2$, and He (gas flow rate ratio $Ar:N_2:He=18:24:32$) at a sputtering gas pressure of 0.2 Pa, the film formation was carried out by setting the power and voltage of the DC power supply to 1.8 kW and 338V, respectively, in the metallic mode, thereby forming a CrN film (Cr content in the film:60 at %) to a thickness of 20 nm.

FIG. 18 shows the structure of a photomask blank used in Comparative Example 9, the processing properties thereof, and the resolution of a light-shielding film pattern in an obtained photomask.

COMPARATIVE EXAMPLE 10

Comparative Example 10 was the same as Reference Example (2-16) except that, in Reference Example (2-16), the CrN film being the etching mask film 20 was changed to a Cr film and the film formation was carried out under the following conditions.

Specifically, the Cr film being the etching mask film 20 was formed such that, using a chromium target and using Ar at a sputtering gas pressure of 0.2 Pa, the film formation was carried out by setting the power and voltage of the DC power supply to 1.8 kW and 330V, respectively, in the metallic mode, thereby forming a Cr film of pure chromium with a Cr content of 100 at % to a thickness of 20 nm.

FIG. 18 shows the structure of a photomask blank used in Comparative Example 10, the processing properties thereof, and the resolution of a light-shielding film pattern in an obtained photomask.

COMPARATIVE EXAMPLE 11

Comparative Example 11 was the same as Reference Example (1-16) except that, in Reference Example (1-16), the CrN film being the etching mask film 20 was changed to a Cr film and the film formation was carried out under the following conditions.

Specifically, the Cr film being the etching mask film 20 was formed such that, using a chromium target and using Ar at a sputtering gas pressure of 0.2 Pa, the film formation was carried out by setting the power and voltage of the DC power supply to 1.8 kW and 330V, respectively, in the metallic mode, thereby forming a Cr film of pure chromium with a Cr content of 100 at % to a thickness of 20 nm.

FIG. 18 shows the structure of a photomask blank used in Comparative Example 11, the processing properties thereof, and the resolution of a light-shielding film pattern in an obtained photomask.

COMPARATIVE EXAMPLE 12

Comparative Example 12 was the same as Example (1-21) except that, in Example (1-21), the film formation was carried out under the following conditions with respect to the MoSi MoSiN (light-shielding layer) 12 in the light-shielding film 10 to change the thickness and Si content thereof and to change the total thickness of the light-shielding film 10.

As the MoSiN (light-shielding layer) 12 in the light-shielding film 10, a film comprising molybdenum, silicon, and nitrogen (Mo:6 at %, Si:75.8 at %, N, 18.2 at %) was formed to a thickness of 62 nm.

The total thickness of the light-shielding film 10 was set to 70 nm. The optical density (OD) of the light-shielding film 10 was 3 at the wavelength 193 nm of ArF excimer laser exposure light.

FIG. 18 shows the structure of a photomask blank used in Comparative Example 12, the processing properties thereof, and the resolution of a light-shielding film pattern in an obtained photomask.

COMPARATIVE EXAMPLE 13

Comparative Example 13 was the same as Reference Example (4-11) except that, in Reference Example (4-11), the CrN film being the etching mask film 20 was formed under the following conditions so that the Cr content of the CrN film was changed from 50 at % to 90 at %.

Specifically, the CrN film being the etching mask film 20 was formed such that, using a chromium target and using Ar, $N_2$, and He (gas flow rate ratio Ar:$N_2$:He=18:18:32) at a sputtering gas pressure of 0.2 Pa, the film formation was carried out by setting the power and voltage of the DC power supply to 1.8 kW and 335V, respectively, in the metallic mode, thereby forming a CrN film (Cr content in the film:90 at %) to a thickness of 10 nm.

FIG. 18 shows the structure of a photomask blank used in Comparative Example 13, the processing properties thereof, and the resolution of a light-shielding film pattern in an obtained photomask.

COMPARATIVE EXAMPLE 14

Comparative Example 14 was the same as Example (1-17) except that, in Example (1-17), the film formation was carried out under the following conditions with respect to the MoSi film (light-shielding layer) 12 in the light-shielding film 10 to change the thickness of the MoSi film (light-shielding layer) 12, to change the Si content of the MoSi film (light-shielding layer) 12, and to change the total thickness of the light-shielding film 10.

The MoSi film (light-shielding layer) 12 in the light-shielding film 10 was formed such that, using a target of Mo:Si=8:92 (at % ratio) and using Ar at a sputtering gas pressure of 0.1 Pa, a film comprising molybdenum and silicon (Mo:8 at %, Si:92 at %) was formed to a thickness of 38 nm by setting the power of the DC power supply to 2.0 kW so that the total thickness of the light-shielding film 10 was set to 60 nm.

FIG. 18 shows the structure of a photomask blank used in Comparative Example 14, the processing properties thereof, and the resolution of a light-shielding film pattern in an obtained photomask.

(Evaluation)

In FIGS. 4 to 18, when the resist film remained with a thickness of 50 nm or more after dry etching of the etching mask film, it was judged good because there was no degradation in LER of a resist pattern. On the other hand, when the etching mask film remained with a thickness of 3.0 nm or more after dry etching of the light-shielding film, it was judged good because there was no degradation in LER of an etching mask pattern.

The CD linearity and the CD uniformity were each judged good when a value required for DRAM hp32 nm is satisfied. The CD uniformity was evaluated with particular attention paid to the degree of degradation due to stripping of the etching mask film.

Further, when the laminated film comprising the light-shielding film and the etching mask film had a sheet resistance value of 3.0 kΩ/square or less as required in electron beam writing exposure, it was judged good. The sheet resistance value was measured by the four-terminal measurement method.

In Examples (1-1) to (1-12), Reference Examples (1-13) to (1-16), and Examples (1-17) to (1-24), the thickness of the resist film after dry etching of the etching mask film varied in a range between a maximum of 93.6 nm (Example 1-9) and a minimum of 70.1 nm (Example 1-16) and the thickness of the etching mask film after dry etching of the light-shielding film varied in a range between a minimum of 3.1 nm (Example 1-21) and a maximum of 18.6 nm (Example 1-4, etc.).

In Examples (1-1) to (1-12), Reference Examples (1-13) to (1-16), and Examples (1-17) to (1-24), the resolution of the resist film (LER with less than 40 nm, resist collapse, etc.) was good, LER of the etching mask film was good, and further, the resolution of the light-shielding film pattern in the obtained photomask was less than 40 nm.

In Examples (1-1) to (1-12) and Examples (1-17) to (1-24), the sheet resistance value of the light-shielding film alone and the sheet resistance value of the laminated film satisfied 3.0 kΩ/square or less and the CD linearity and the CD uniformity were also good.

In Reference Examples (1-13) to (1-16), the sheet resistance value of the laminated film satisfied 3.0 kΩ/square or less, but the Cr content of the etching mask film was 50 at %, i.e. relatively high, so that the etching rate for a chlorine-based gas was low. As a consequence, it was not possible to suppress the microloading phenomenon and further the etching mask film was not easily stripped so that the CD linearity and the CD uniformity were both bad.

In Examples (2-1) to (2-12) and Reference Examples (2-13) to (2-16), the thickness of the resist film after dry etching of the etching mask film varied in a range between a maximum of 92.7 nm (Example 2-9) and a minimum of 66.2 nm (Reference Example 2-16) and the thickness of the etching mask film after dry etching of the light-shielding film varied in a range between a minimum of 3.6 nm (Example 2-1, etc.) and a maximum of 18.6 nm (Example 2-4, etc.).

In Examples (2-1) to (2-12) and Reference Examples (2-13) to (2-16), the resolution of the resist film (LER with less than 40 nm, resist collapse, etc.) was good, LER of the etching mask film was good, and further, the resolution of the light-shielding film pattern in the obtained photomask was less than 40 nm.

In Examples (2-1) to (2-12), the sheet resistance value of the light-shielding film alone and the sheet resistance value of the laminated film satisfied 3.0 kΩ/square or less and the CD linearity and the CD uniformity were also good.

In Reference Examples (2-13) to (2-16), the sheet resistance value of the laminated film satisfied 3.0 kΩ/square or less, but the Cr content of the etching mask film was 50 at %, i.e. relatively high, so that the etching rate for a chlorine-based gas was low. As a consequence, it was not possible to suppress the microloading phenomenon and further the etching mask film was not easily stripped so that the CD linearity and the CD uniformity were both bad.

In Examples (2-17) to (2-24), the thickness of the resist film after dry etching of the etching mask film varied in a range between a maximum of 70.3 nm (Example 2-21) and a minimum of 66.5 nm (Example 2-24) and the thickness of the etching mask film after dry etching of the light-shielding film was 18.6 nm in each Example.

In Examples (2-17) to (2-24), the resolution of the resist film (LER with less than 40 nm, resist collapse, etc.) was good, LER of the etching mask film was good, and further, the resolution of the light-shielding film pattern in the obtained photomask was less than 40 nm.

In Examples (2-17) to (2-24), the sheet resistance value of the light-shielding film alone and the sheet resistance value of the laminated film satisfied 3.0 kΩ/square or less and the CD linearity was also good. However, since the Cr content of the etching mask film was 40 at % or 45 at %, the etching mask film was not easily stripped so that the CD uniformity was bad.

In Examples (3-1) to (3-12) and Reference Examples (3-13) to (3-16), the thickness of the resist film after dry etching of the etching mask film varied in a range between a maximum of 83.6 nm (Example 3-9) and a minimum of 60.1 nm (Reference Example 3-16) and the thickness of the etching mask film after dry etching of the light-shielding film varied in a range between a minimum of 3.6 nm (Example 3-1, etc.) and a maximum of 18.6 nm (Example 3-4, etc.).

In Examples (3-1) to (3-12) and Reference Examples (3-13) to (3-16), the resolution of the resist film (LER with less than 40 nm, resist collapse, etc.) was good, LER of the etching mask film was good, and further, the resolution of the light-shielding film pattern in the obtained photomask was less than 40 nm.

In Examples (3-1) to (3-12), the sheet resistance value of the light-shielding film alone and the sheet resistance value of the laminated film satisfied 3.0 kΩ/square or less and the CD linearity and the CD uniformity were also good.

In Reference Examples (3-13) to (3-16), the sheet resistance value of the laminated film satisfied 3.0 kΩ/square or less, but the Cr content of the etching mask film was 50 at %, i.e. relatively high, so that the etching rate for a chlorine-based gas was low. As a consequence, it was not possible to suppress the microloading phenomenon and further the etching mask film was not easily stripped so that the CD linearity and the CD uniformity were both bad.

In Examples (3-17) to (3-24), the thickness of the resist film after dry etching of the etching mask film varied in a range between a maximum of 63.7 nm (Example 3-21) and a minimum of 60.3 nm (Example 3-24) and the thickness of the etching mask film after dry etching of the light-shielding film was 18.6 nm in each Example.

In Examples (3-17) to (3-24), the resolution of the resist film (LER with less than 40 nm, resist collapse, etc.) was good, LER of the etching mask film was good, and further, the resolution of the light-shielding film pattern in the obtained photomask was less than 40 nm.

In Examples (3-17) to (3-24), the sheet resistance value of the light-shielding film alone and the sheet resistance value of the laminated film satisfied 3.0 kΩ/square or less and the CD linearity was also good. However, since the Cr content of the etching mask film was 40 at % or 45 at %, the etching mask film was not easily stripped so that the CD uniformity was bad.

In Examples (4-1) to (4-9) and Reference Examples (4-10) to (4-12), the thickness of the resist film after dry etching of the etching mask film varied in a range between a maximum of 68.6 nm (Example 4-7) and a minimum of 52.5 nm (Reference Example 4-12) and the thickness of the etching mask film after dry etching of the light-shielding film varied in a range between a minimum of 3.6 nm (Example 4-1, etc.) and a maximum of 13.6 nm (Example 4-3, etc.).

In Examples (4-1) to (4-12), the resolution of the resist film (LER with less than 40 nm, resist collapse, etc.) was good, LER of the etching mask film was good, and further, the resolution of the light-shielding film pattern in the obtained photomask was less than 40 nm.

In Examples (4-1) to (4-9), the sheet resistance value of the light-shielding film alone and the sheet resistance value of the laminated film satisfied 3.0 kΩ/square or less and the CD linearity and the CD uniformity were also good.

In Reference Examples (4-10) to (4-12), the sheet resistance value of the laminated film satisfied 3.0 kΩ/square or less, but the Cr content of the etching mask film was 50 at %, i.e. relatively high, so that the etching rate for a chlorine-based gas was low. As a consequence, it was not possible to suppress the microloading phenomenon and further the etching mask film was not easily stripped so that the CD linearity and the CD uniformity were both bad.

In Examples (4-13) to (4-20), the thickness of the resist film after dry etching of the etching mask film varied in a range between a maximum of 55.3 nm (Example 4-17) and a minimum of 52.7 nm (Example 4-20) and the thickness of the etching mask film after dry etching of the light-shielding film was 13.6 nm in each Example.

In Examples (4-13) to (4-20), the resolution of the resist film (LER with less than 40 nm, resist collapse, etc.) was good, LER of the etching mask film was good, and further, the resolution of the light-shielding film pattern in the obtained photomask was less than 40 nm.

In Examples (4-13) to (4-20), the sheet resistance value of the light-shielding film alone and the sheet resistance value of the laminated film satisfied 3.0 kΩ/square or less and the CD linearity was also good. However, since the Cr content of the etching mask film was 40 at % or 45 at %, the etching mask film was not easily stripped so that the CD uniformity was bad.

In Examples (5-1) to (5-6) and Reference Examples (5-7) and (5-8), the thickness of the resist film after dry etching of the etching mask film varied in a range between a maximum of 58.6 nm (Example 5-5) and a minimum of 50.3 nm (Reference Example 5-8) and the thickness of the etching mask film after dry etching of the light-shielding film varied in a range between a minimum of 3.6 nm (Example 5-1, etc.) and a maximum of 8.6 nm (Example 5-2, etc.).

In Examples (5-1) to (5-6) and Reference Examples (5-7) and (5-8), the resolution of the resist film (LER with less than 40 nm, resist collapse, etc.) was good, LER of the etching mask film was good, and further, the resolution of the light-shielding film pattern in the obtained photomask was less than 40 nm.

In Examples (5-1) to (5-6), the sheet resistance value of the light-shielding film alone and the sheet resistance value of the laminated film satisfied 3.0 kΩ/square or less and the CD linearity and the CD uniformity were also good.

In Reference Examples (5-7) and (5-8), the sheet resistance value of the laminated film satisfied 3.0 kΩ/square or less, but the Cr content of the etching mask film was 50 at %, i.e. relatively high, so that the etching rate for a chlorine-based gas was low. As a consequence, it was not possible to suppress the microloading phenomenon and further the etching mask film was not easily stripped so that the CD linearity and the CD uniformity were both bad.

In Examples (5-9) to (5-16), the thickness of the resist film after dry etching of the etching mask film varied in a range between a maximum of 51.9 nm (Example 5-13) and a minimum of 50.4 nm (Example 5-16) and the thickness of the etching mask film after dry etching of the light-shielding film was 8.6 nm in each Example.

In Examples (5-9) to (5-16), the resolution of the resist film (LER with less than 40 nm, resist collapse, etc.) was good, LER of the etching mask film was good, and further, the resolution of the light-shielding film pattern in the obtained photomask was less than 40 nm.

In Examples (5-9) to (5-16), the sheet resistance value of the light-shielding film alone and the sheet resistance value of the laminated film satisfied 3.0 kΩ/square or less and the CD linearity was also good. However, since the Cr content of the etching mask film was 40 at % or 45 at %, the etching mask film was not easily stripped so that the CD uniformity was bad.

COMPARATIVE EXAMPLE 1

In Comparative Example 1, although the etching mask film 20 was a CrOCN film (Cr content of the film was 33 at %), the thickness thereof was as thin as 4 nm so that the thickness of the etching mask film after dry etching of the light-shielding film was reduced to 2.6 nm. As a consequence, LER of the etching mask film was bad and the resolution being less than 40 nm of the light-shielding film pattern was not realized in the obtained photomask.

COMPARATIVE EXAMPLE 2

In Comparative Example 2, although the etching mask film 20 was a CrOCN film (Cr content of the film was 33 at %), the thickness thereof was as thick as 30 nm so that the thickness of the resist film after dry etching of the etching mask film was reduced to 49.6 nm. As a consequence, the resolution of the resist film (LER with less than 40 nm) was bad and the resolution being less than 40 nm of the light-shielding film pattern was not realized in the obtained photomask.

COMPARATIVE EXAMPLES 3 AND 4

In Comparative Examples 3 and 4, the thickness of the resist 50 was as thick as 120 nm so that the aspect ratio was as large as 1:3. As a consequence, the collapse of the resist pattern occurred and the resolution being less than 40 nm of the light-shielding film pattern was not realized in the obtained photomask.

COMPARATIVE EXAMPLES 5 TO 9 AND 13

In Comparative Examples 5 to 9 and 13, the etching mask film 20 was a CrN film and the Cr content of the film exceeded 50 at % and was as high as 60% or 90% so that the etching rate for a chlorine-based gas was low. Therefore, the consumption of the resist film during dry etching of the etching mask film was large and thus the thickness of the resist film after the dry etching was reduced to be thin. As a consequence, LER of the etching mask film was bad and the resolution being less than 40 nm of the light-shielding film pattern was not realized in the obtained photomask.

Further, in Comparative Examples 5 to 9 and 13, the sheet resistance value of the laminated film satisfied 3.0 kΩ/square or less, but the Cr content of the etching mask film was high so that the etching rate for a chlorine-based gas was low. As a consequence, it was not possible to suppress the microloading phenomenon and further the etching mask film was not easily stripped so that the CD linearity and the CD uniformity were both bad.

COMPARATIVE EXAMPLES 10 AND 11

In Comparative Examples 10 and 11, the etching mask film 20 was a Cr film and the Cr content of the film was as high as 100% so that the etching rate for a chlorine-based gas was low. Therefore, the consumption of the resist film during dry etching of the etching mask film was large and thus the thickness of the resist film after the dry etching was reduced to be thin. As a consequence, LER of the etching mask film was bad and the resolution being less than 40 nm of the light-shielding film pattern was not realized in the obtained photomask.

Further, in Comparative Examples 10 and 11, the sheet resistance value of the laminated film satisfied 3.0 kΩ/square or less, but the Cr content of the etching mask film was high so that the etching rate for a chlorine-based gas was low. As a consequence, it was not possible to suppress the microloading phenomenon and further the etching mask film was not easily stripped so that the CD linearity and the CD uniformity were both bad.

COMPARATIVE EXAMPLE 12

In Comparative Example 12, the MoSiN (light-shielding layer) 12 in the light-shielding film 10 had a low Mo content of 6 at % and a large thickness of 62 nm and the total thickness of the light-shielding film 10 was as thick as 70 nm. As a consequence, the time for the etching mask film to be subjected to physical etching was prolonged while the light-shielding film was dry-etched with a fluorine-based gas. Since the thickness of the etching mask film after the dry etching of the light-shielding film was reduced to 2.9 nm, LER of the etching mask film was bad and the resolution being less than 40 nm of the light-shielding film pattern was not realized in the obtained photomask.

Further, in Comparative Examples 12 and 14, since the MoSiN (light-shielding layer) 12 in the light-shielding film 10 had a low Mo content of 6 at % or 8 at %, the sheet resistance value of the laminated film did not satisfy 3.0 kΩ/square or less.

As appreciated from the above, according to this invention, there was obtained a high-quality photomask suitable for the hp32 nm generation and further for the hp22 nm generation.

Further, with respect to the resolution of a transfer pattern formed on the mask, the resolution of a transfer pattern of less than 40 nm was made possible.

While this invention has been described with reference to the Examples, the technical scope of the invention is not limited to the scope of the description of the above-mentioned Examples. It is obvious to a person skilled in the art that various changes or improvements can be added to the above-mentioned Examples. It is clear from the description of claims that the modes added with such changes or improvements can also be included in the technical scope of this invention.

BRIEF DESCRIPTION OF THE DRAWINGS

FIG. 4 is a diagram showing the structures of photomask blanks used in Examples (1-1) to (1-8), the processing properties thereof, and the resolutions of light-shielding film patterns in obtained photomasks.

FIG. 5 is a diagram showing the structures of photomask blanks used in Examples (1-9) to (1-12) and Reference Examples (1-13) to (1-16), the processing properties thereof, and the resolutions of light-shielding film patterns in obtained photomasks.

FIG. 6 is a diagram showing the structures of photomask blanks used in Examples (1-17) to (1-25), the processing properties thereof, and the resolutions of light-shielding film patterns in obtained photomasks.

FIG. 7 is a diagram showing the structures of photomask blanks used in Examples (2-1) to (2-8), the processing properties thereof, and the resolutions of light-shielding film patterns in obtained photomasks.

FIG. 8 is a diagram showing the structures of photomask blanks used in Examples (2-9) to (2-12) and Reference Examples (2-13) to (2-16), the processing properties thereof, and the resolutions of light-shielding film patterns in obtained photomasks.

FIG. 9 is a diagram showing the structures of photomask blanks used in Examples (2-17) to (2-24), the processing properties thereof, and the resolutions of light-shielding film patterns in obtained photomasks.

FIG. 10 is a diagram showing the structures of photomask blanks used in Examples (3-1) to (3-8), the processing properties thereof, and the resolutions of light-shielding film patterns in obtained photomasks.

FIG. 11 is a diagram showing the structures of photomask blanks used in Examples (3-9) to (3-12) and Reference Examples (3-13) to (3-16), the processing properties thereof, and the resolutions of light-shielding film patterns in obtained photomasks.

FIG. 12 is a diagram showing the structures of photomask blanks used in Examples (3-17) to (3-24), the processing properties thereof, and the resolutions of light-shielding film patterns in obtained photomasks.

FIG. 13 is a diagram showing the structures of photomask blanks used in Examples (4-1) to (4-9) and Reference Example (4-10), the processing properties thereof, and the resolutions of light-shielding film patterns in obtained photomasks.

FIG. 14 is a diagram showing the structures of photomask blanks used in Reference Examples (4-11) and (4-12) and Examples (4-13) to (4-20), the processing properties thereof, and the resolutions of light-shielding film patterns in obtained photomasks.

FIG. 15 is a diagram showing the structures of photomask blanks used in Examples (5-1) to (5-6) and Reference Examples (5-7) and (5-8), the processing properties thereof, and the resolutions of light-shielding film patterns in obtained photomasks.

FIG. 16 is a diagram showing the structures of photomask blanks used in Examples (5-9) to (5-16), the processing properties thereof, and the resolutions of light-shielding film patterns in obtained photomasks.

FIG. 17 is a diagram showing the structures of photomask blanks used in Comparative Examples 1 to 8, the processing properties thereof, and the resolutions of light-shielding film patterns in obtained photomasks.

FIG. 18 is a diagram showing the structures of photomask blanks used in Comparative Examples 9 to 14, the processing properties thereof, and the resolutions of light-shielding film patterns in obtained photomasks.

Figure 1:
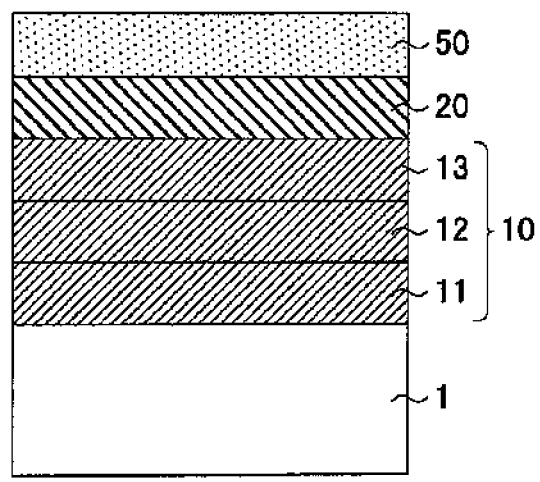
FIG. 1 is an exemplary cross-section showing one example of a photomask blank according to Example 1 of this invention.
Figure 2:
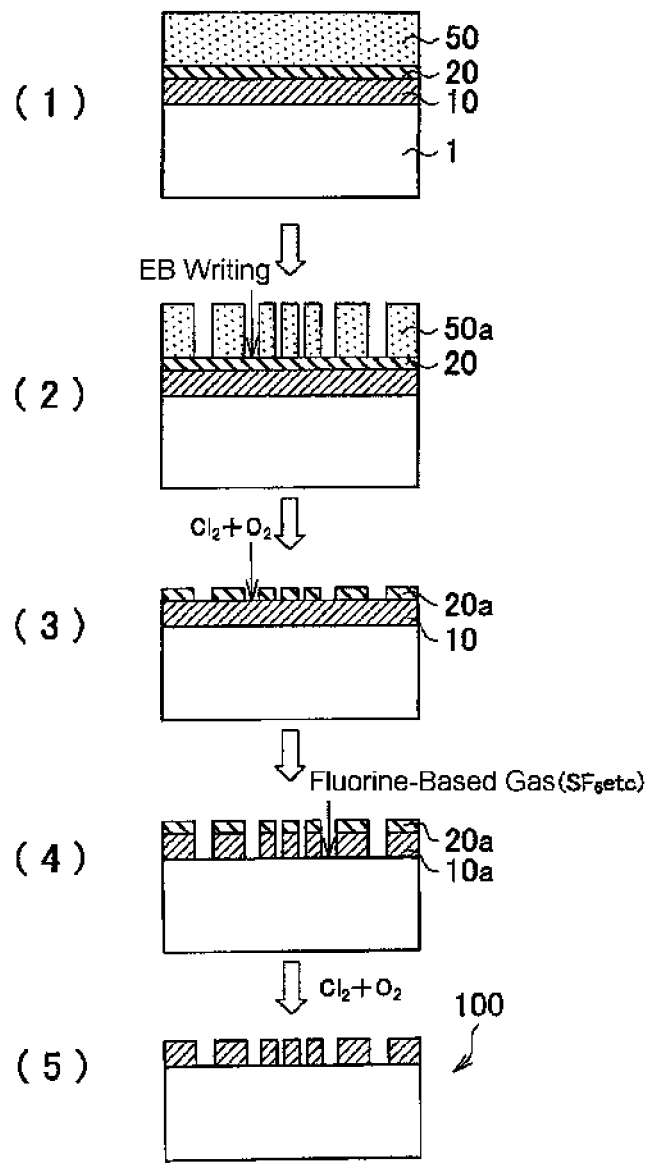
FIG. 2 is an exemplary cross-section for explaining manufacturing processes of a photomask according to Example 1 of this invention.
Figure 3:
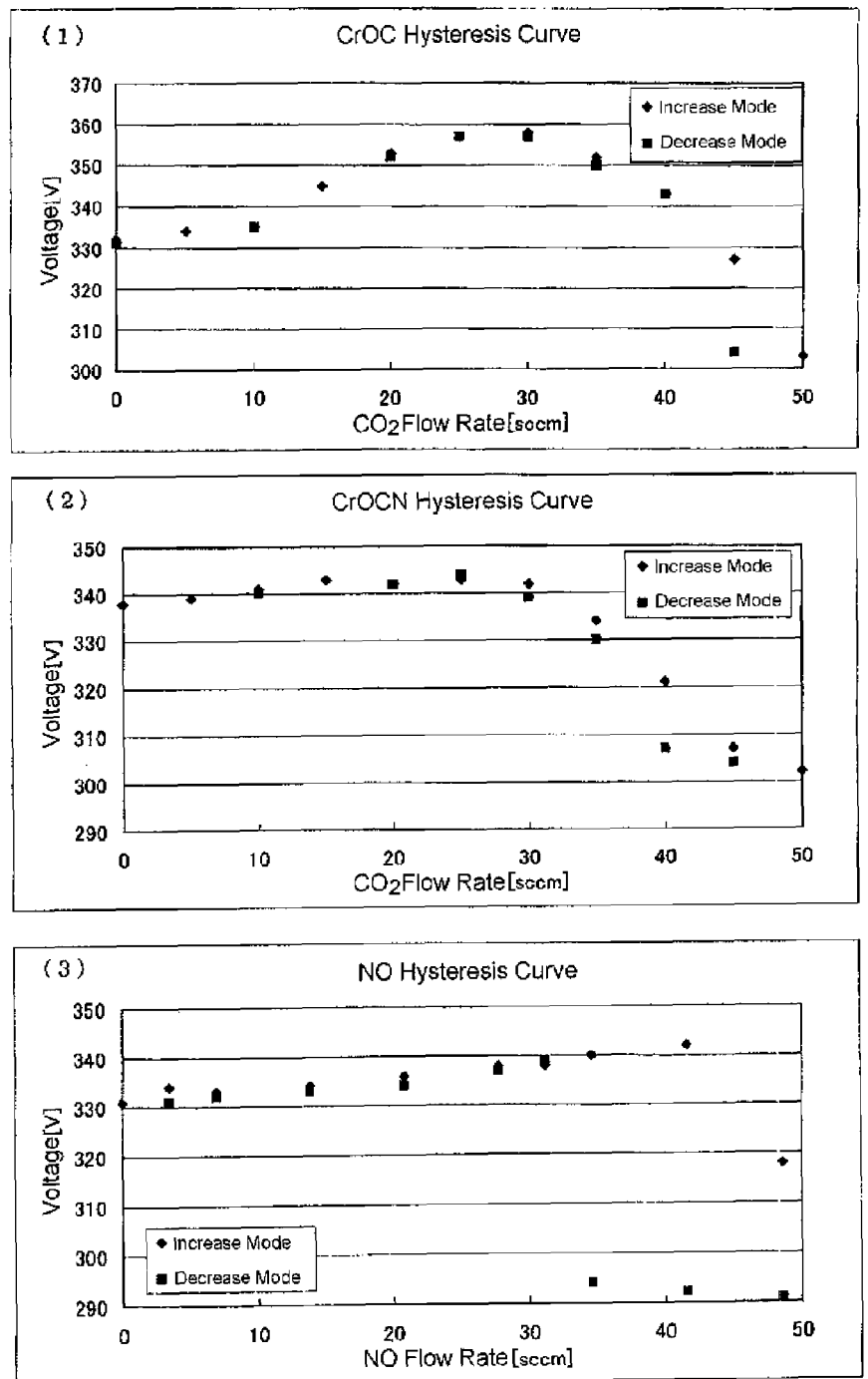
FIG. 3 is a diagram for explaining modes in the formation of an etching mask film 20.
Figure 19:
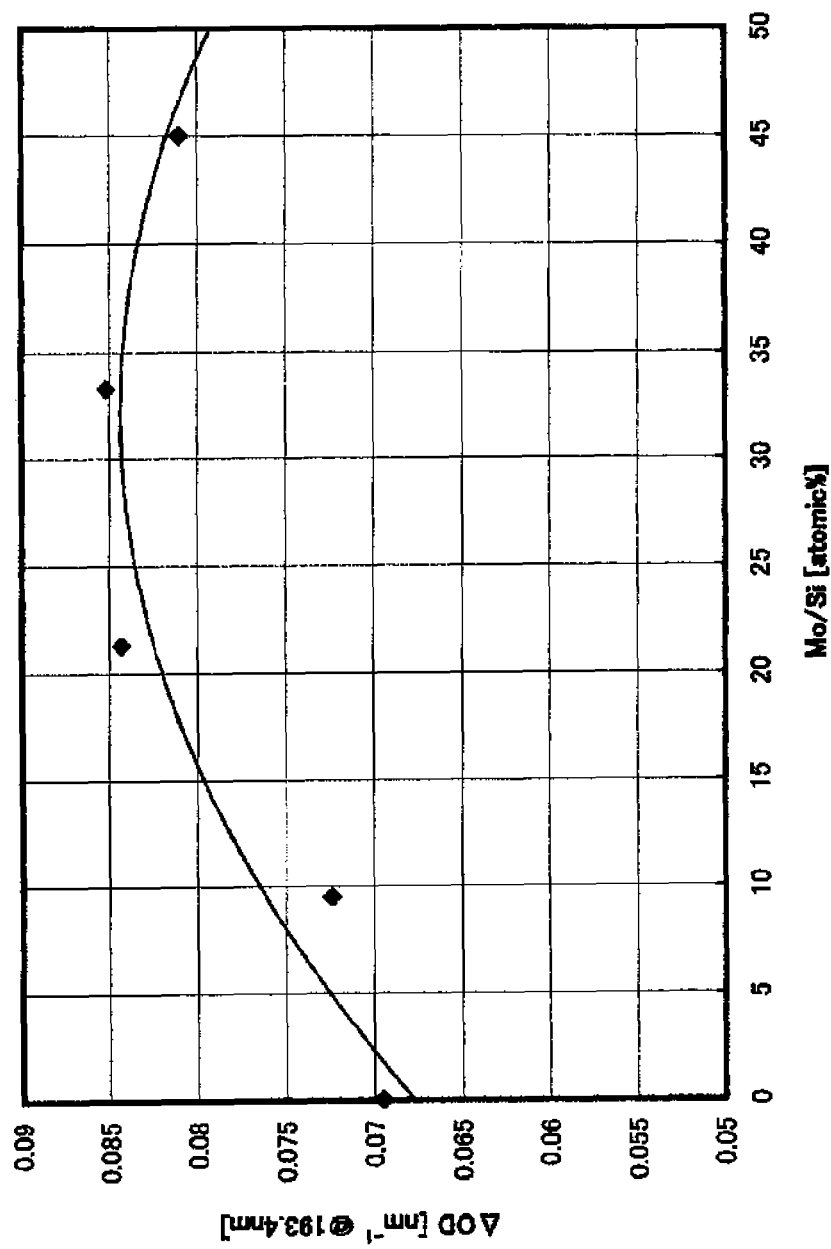
FIG. 19 is a diagram showing the relationship between the molybdenum content and the optical density per unit thickness in a light-shielding layer comprising molybdenum and silicon.
Figure 20:
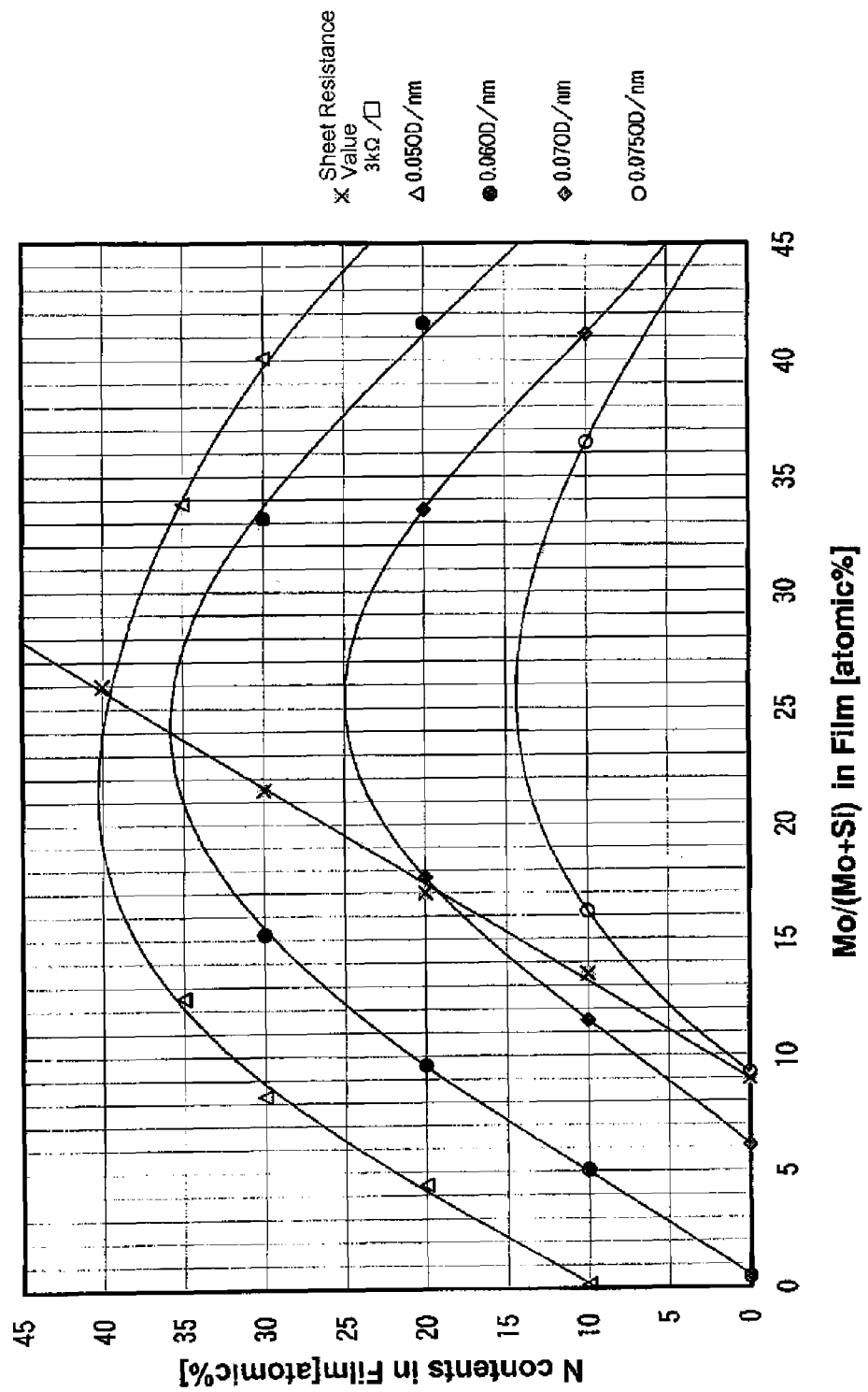
FIG. 20 is a diagram showing the relationship between the molybdenum content, the nitrogen content, and the optical density per unit thickness and the relationship between the molybdenum content, the nitrogen content, and the sheet resistance value, in a light-shielding layer comprising molybdenum, silicon, and nitrogen.

DESCRIPTION OF SYMBOLS 1 transparent substrate
10 light-shielding film
11 back-surface antireflection layer
12 light-shielding layer
13 front-surface antireflection layer
20 etching mask film
50 resist film
100 photomask

The invention claimed is:
1. A photomask blank for use in manufacturing a photomask adapted to be applied with exposure light having a wavelength of 200 nm or less,
wherein the photomask blank comprises
a transparent substrate, a light-shielding film formed on the transparent substrate and containing molybdenum and silicon, an etching mask film formed in contact with the light-shielding film, and a resist film formed on the etching mask film, and wherein the light-shielding film comprises a light-shielding layer and an antireflection layer in this order from the transparent substrate, the etching mask film is made of a single layer formed of a material composed mainly of CrOCN and has a chromium content of 35 at % or less, total content of oxygen and nitrogen of 40 at % or more, and carbon content of 5 at % to 20 at %, the etching mask film being a film which is removed when a photomask is manufactured, a laminated film comprising the light-shielding film and the etching mask film has a sheet resistance value of 3.0 kΩ/square or less, the resist film having a thickness of 90 nm or less, the etching mask film having a thickness of 5 nm to 15 nm, and the light-shielding film having a thickness of 52 nm or less.

2. The photomask blank according to claim 1, wherein the resist film has a thickness of 75 nm or less, and the etching mask film has a thickness of 5 nm or more and 15 nm or less.

3. The photomask blank according to claim 1, wherein the resist film has a thickness of 65 nm or less, and the etching mask film has a thickness of 5 nm or more and 10 nm or less.

4. The photomask blank according to claim 1, wherein the light-shielding layer is formed of a material comprising molybdenum and silicon or a material comprising molybdenum, silicon, and nitrogen.

5. The photomask blank according to claim 1, wherein the light-shielding film comprises two layers, which are the light-shielding layer and the antireflection layer, the light-shielding layer is formed of a material comprising molybdenum, silicon, and nitrogen, and the antireflection layer is formed of a material comprising molybdenum, silicon, and at least one of oxygen and nitrogen.

6. A photomask manufactured by using the photomask blank according to claim 1.

7. A method of manufacturing a semiconductor device by transferring a pattern of the photomask according to claim 6.

8. A method of manufacturing a photomask, comprising preparing the photomask blank according to claim 1, by using a resist pattern as a first etching mask formed on the etching mask film, dry-etching the etching mask film by using a chlorine-based gas containing oxygen to thereby carry out a first pattern transfer, by using a pattern formed in the etching mask film as a second etching mask, dry-etching the light-shielding film by using a fluorine-based gas to thereby carry out a second pattern transfer, and carrying out dry etching by using a chlorine-based gas containing oxygen after the second pattern transfer to the light-shielding film, thereby removing a remaining portion of the etching mask film to form the photomask.

9. The photomask blank according to claim 1, wherein the antireflection layer contains molybdenum, silicon, and at least one of oxygen and nitrogen, further wherein a content ratio of molybdenum to silicon is 1:6 or more in the antireflection layer.

10. The photomask blank according to claim 9, wherein a content of molybdenum is less than 10 at % in the antireflection layer.

11. The photomask blank according to claim 9, wherein total content of nitrogen and oxygen is 30 at % or more in the antireflection layer.

12. The photomask blank according to claim 9, wherein the antireflection layer has a thickness of 7 nm to 15 nm.

* * * * *